United States Patent
Hosoya et al.

(10) Patent No.: US 7,893,782 B2
(45) Date of Patent: Feb. 22, 2011

(54) VOLTAGE-CONTROLLED OSCILLATOR

(75) Inventors: Kenichi Hosoya, Minato-ku (JP);
Hiroyuki Okada, Minato-ku (JP)

(73) Assignee: NEC Corporation, Tokyo (JP)

( * ) Notice: Subject to any disclaimer, the term of this patent is extended or adjusted under 35 U.S.C. 154(b) by 63 days.

(21) Appl. No.: 12/489,789

(22) Filed: Jun. 23, 2009

(65) Prior Publication Data

US 2009/0322436 A1    Dec. 31, 2009

(30) Foreign Application Priority Data

Jun. 25, 2008    (JP)    ............................. 2008-165344

(51) Int. Cl.
*H03B 5/08*    (2006.01)

(52) U.S. Cl. ................. 331/117 FE; 331/167; 331/179; 331/177 V

(58) Field of Classification Search ........... 331/117 FE, 331/167, 179, 177 V, 36 C
See application file for complete search history.

(56) References Cited

U.S. PATENT DOCUMENTS

| 7,474,166 B2 * | 1/2009 | Tanaka .................... 331/177 V |
| 7,518,458 B2 | 4/2009 | Nakamura et al. |
| 2005/0030116 A1 * | 2/2005 | Takagi .................... 331/177 V |
| 2007/0103248 A1 | 5/2007 | Nakamura et al. |

FOREIGN PATENT DOCUMENTS

| JP | 2004-254162 A | 9/2004 |
| JP | 2005-311690 A | 11/2005 |
| JP | 2007-267353 A | 10/2007 |

* cited by examiner

*Primary Examiner*—Joseph Chang
(74) *Attorney, Agent, or Firm*—Sughrue Mion, PLLC

(57) ABSTRACT

A voltage-controlled oscillator comprises an inductor and a group of variable capacitance elements forming a resonance circuit. The group of variable capacitance elements includes first and second variable capacitance elements connectable in parallel and having mutually different absolute values of a ratio of control-voltage sensitivity to capacitance. The first and second variable capacitance elements both have a first end supplied with a control voltage for controlling resonance frequency of the resonance circuit and have a second end selectively connected to the inductor by a band selection signal for deciding a band in which the resonance frequency exists.

11 Claims, 31 Drawing Sheets

VOLTAGE-CONTROLLED OSCILLATOR

REFERENCE TO RELATED APPLICATION

This application is based upon and claims the benefit of the priority of Japanese patent application No. 2008-165344, filed on Jun. 25, 2008, the disclosure of which is incorporated herein in its entirety by reference thereto.

TECHNICAL FIELD

This invention relates to a voltage-controlled oscillator (VCO) and, more particularly, to a voltage-controlled oscillator that operates in multiple frequency bands.

BACKGROUND

Voltage-controlled oscillators are in wide use in a variety of electronic devices. In particular, in PLL (phase-locked loop) circuits and in CDR (clock and data recovery) circuits, a voltage-controlled oscillator is used within the loop and generates a desired clock signal. In case of use in the high-frequency band, often such a voltage-controlled oscillator is constituted by a resonance circuit composed of an inductor and a voltage-controllable variable capacitance element. Furthermore, in case of use in a communication device, the voltage-controlled oscillator is equipped with a plurality of variable capacitance elements so as to operate in multiple frequency bands and is so adapted that the oscillation frequency is changed by changing over among these variable capacitance elements.

FIG. 29 is a circuit diagram illustrating a typical example of a differential-type voltage-controlled oscillator that operates in multiple frequency bands. This voltage-controlled oscillator (VCO) comprises a power supply terminal 1, output terminals 2a, 2b, a loop control terminal 3, frequency-band selection terminals 41, 42, 43, cross-coupled NMOS transistors 5a, 5b, cross-coupled PMOS transistors 6a, 6b, an inductor 7, variable capacitance elements 8a, 8b, switched-capacitance bank units 13c, 13d and an output buffer 16. The portions constituted by the variable capacitance elements 8a, 8b are referred to as variable capacitance units 9a, 9b, respectively.

The NMOS transistor 5a has a source connected to ground and a drain connected to a first end of the switched-capacitance bank unit 13c, a first input end of the output buffer 16, a first end of the variable capacitance element 8a, a first end of the inductor 7 and the drain of the PMOS transistor 6a. The NMOS transistor 5b has a source connected to ground and a drain connected to a first end of the switched-capacitance bank unit 13d, a second input end of the output buffer 16, a first end of the variable capacitance element 8b, a second end of the inductor 7 and the drain of the PMOS transistor 6b. The sources of the PMOS transistors 6a, 6b are connected to the power supply terminal 1. A second end of the variable capacitance element 8a and a second end of the variable capacitance element 8b are connected in common with the loop control terminal 3.

The switched-capacitance bank unit 13c has fixed capacitance elements 181a, 182a, 183a and transistors 101a, 102a, 103a, which are switching elements, and the switched-capacitance bank unit 13d has fixed capacitance elements 181b, 182b, 183b and transistors 101b, 102b, 103b, which are switching elements. First ends of respective ones of the transistors 101a, 102a, 103a, 101b, 102b, 103b are connected to ground. Second ends of respective ones of the transistors 101a (i=1, 2, 3) constitute the first end of the switched-capacitance bank unit 13c via respective ones of the fixed capacitance elements 18ia. Second ends of respective ones of the transistors 10ib (i=1, 2, 3) constitute the first end of the switched-capacitance bank unit 13d via respective ones of the fixed capacitance elements 18ib. Control ends of the transistors 10ia (i=1, 2, 3) and control ends of the transistors 10ib (i=1, 2, 3) are connected to respective ones of the frequency-band selection terminals 4i (i=1, 2, 3).

The output buffer 16 has output transistors 14a, 14b and output resistors 15a, 15b. The output transistor 14a has a source connected to ground, a gate serving as a first input terminal of the output buffer 16 and a drain connected to the output terminal 2b and to the power supply terminal 1 via the output resistor 15a. The output transistor 14b has a source connected to ground, a gate serving as a second input terminal of the output buffer 16 and a drain connected to the output terminal 2a and to the power supply terminal 1 via the output resistor 15b.

The fixed capacitance elements 181a, 182a, 183a, 181b, 182b, 183b usually are implemented by fixed capacitors such as MIM (Metal Insulator Metal) capacitors. With regard to capacitance values C1, C2, C3, C1, C2, C3 of the fixed capacitance elements 181a, 182a, 183a, 181b, 182b, 183b, respectively, the resistance values C1, C2, C3 usually are set to values that differ from one another. Band setting signals VSW1, VSW2, VSW3 that are input to the frequency-band selection terminals 41, 42, 43, respectively, are controlled as high-level, low-level binary values, thereby changing the capacitance values in the switched-capacitance bank units 13c, 13d and, hence, changing over the oscillation frequency of the voltage-controlled oscillator. Although this example illustrates a case in which the number of bits constituting the respective band selection signals is three, the number of bits is set to any number as required.

The operation of the VCO set forth above will now be described. The cross-coupled portion formed by the NMOS transistors 5a, 5b and the cross-coupled portion formed by the PMOS transistors 6a, 6b produce negative resistance. Owing to the fact that this negative resistance compensates for loss, which are generated in other portions of the circuit, at the oscillation frequency, a sustained oscillatory operation is realized.

Oscillation frequency f is expressed approximately by the following equation as a function of control voltage $V_{CNT}$ applied to the loop control terminal 3:

$$f(v_{CNT}) = \frac{1}{2\pi} \frac{1}{\sqrt{\left(\frac{L}{2}\right)[C_f + C_v(v_{CNT}) + C_{SW}]}} \quad (1)$$

A frequency $f(V_{CNT}0)$ that prevails when the control voltage $V_{CNT}$ is a center voltage $V_{CNT}0$ is referred to as the "center frequency". Here $C_f$ represents the contribution of a parasitic capacitance component of portions other than variable capacitance units 9a, 9b of the NMOS transistors 5a, 5b and PMOS transistors 6a, 6b, etc. Further, $C_V$ represents the capacitance of the variable capacitance units 9a, 9b, and $C_{SW}$ represents the capacitance of the switched-capacitance bank units 13c, 13d. The capacitance $C_{SW}$ can be set to eight values of from 0 to (C1+C2+C3) by the input signals to the frequency-band selection terminals 41, 42, 43. In order to simplify the description, the capacitance of the switching transistors 101a, 102a, 103a, 101b, 102b, 103b is ignored. Further, since the circuitry is differential circuitry, $C_f$, $C_v$, $C_{SW}$ represent the contributions only on one side. In addition, L is the inductance of the inductor 7.

The center frequency can be varied discretely by changing the value of $C_{SW}$, thereby making multiband operation possible. The VCO gain in this case is as follows:

$$\frac{\partial f}{\partial v_{CNT}}\bigg|_{v_{CNT}=v_0} = -\frac{1}{4\pi\sqrt{\frac{L}{2}}} \frac{1}{[C_f + C_v(v_{CNT}=v_0) + C_{SW}]^{\frac{3}{2}}} \frac{\partial C_v}{\partial v_{CNT}}\bigg|_{v_{CNT}=v_0} \quad (2)$$

The gain of the conventional multiband VCO shown in FIG. 29 is given by Equation (2). In a case where the center frequency is varied to perform multiband operation by setting the band selection signals VSW1, VSW2, VSW3 of the frequency-band selection terminals 41, 42, 43, respectively, only $C_{SW}$ within the square brackets [ ] of the denominator changes and the other elements remain unchanged among the elements that constitute the VCO gain. Accordingly, a change in the center frequency (a band selection) is accompanied by a fluctuation in the gain of the VCO. In a case where $C_{SW}$ is increased and the center frequency is lowered in accordance with Equation (1), VCO gain declines in Equation (2). Conversely, in a case where $C_{SW}$ is decreased and the center frequency is raised in accordance with Equation (1), VCO gain increases in Equation (2). Accordingly, the relationship between center frequency and VCO gain is as shown in FIG. 30.

VCO gain is a parameter that has strong influence upon the loop characteristics of the PLL and CDR circuit. If VCO gain fluctuates in dependence upon the center frequency, the characteristic of the PLL formed using this VCO will fluctuate in dependence upon the operating frequency, and the characteristic of the CDR circuit will fluctuate in dependence upon the operating speed. This makes it difficult to achieve stable operation in the PLL which operates in multiple frequency bands and in the CDR circuit which operates at multiple bit rates.

A voltage-controlled oscillator with little frequency conversion gain (VCO gain) fluctuation is disclosed in Patent Document 1. This voltage-controlled oscillator has a configuration using a parallel circuit composed of a first variable capacitance element and a first switched-capacitance bank unit, and a series circuit composed of a second variable capacitance element and a second switched-capacitance bank unit.

Patent Document 2 discloses a PLL circuit arrangement in which a voltage adjusting circuit for performing a voltage conversion with respect to an output signal of a charge pump circuit is inserted into a PLL loop and the voltage conversion coefficients of the voltage adjusting circuit are varied in accordance with a band selection signal of a VCO.

Patent Document 3 discloses a voltage-controlled oscillator that includes a resonance circuit having an inductor and a plurality of variable capacitors the capacitance values whereof can be varied by a control voltage, the oscillator further including a variable-capacitor selecting unit, the selecting operation of which is controlled by a variable-capacitor setting signal, for selecting a variable capacitor, which supplies control voltage, from among the plurality of variable capacitors, wherein each of the plurality of variable capacitors comprises two variable capacitors of different polarities in terms of a change in capacitance thereof in response to control voltage.

The voltage-controlled oscillator of Patent Document 3 will be described in detail. FIG. 31 is a circuit diagram representing in detail a resonance circuit in the voltage-controlled oscillator of Patent Document 3. In order to simplify the drawing, only the resonance circuit relating to one set of variable capacitors is extracted and illustrated. The resonance circuit has an inductor L and variable capacitors C101, C102 the capacitance values of which are can be varied by a control voltage VCONT. The variable capacitors C101, C102 are selectively operated by a variable-capacitor setting signal. Whether the variable capacitors C101, C102 are connected at first ends thereof to a power supply VDD or are supplied with the control voltage VCONT is selected by operatively associated switching elements S101, S102. It should be noted that the variable capacitors C101, C102 exhibit different polarities in terms of the change in capacitance thereof in response to the control voltage VCONT.

[Patent Document 1]
Japanese Patent Kokai Publication No. JP2007-267353A
[Patent Document 2]
Japanese Patent Kokai Publication No. JP2005-311690A
[Patent Document 3]
Japanese Patent Kokai Publication No. JP2004-254162A

SUMMARY

The disclosures of the above Patent Documents are incorporated herein by reference thereto. Now, the following analyses are given by the present invention.

In accordance with the voltage-controlled oscillator disclosed in Patent Document 1, it is possible to suppress a fluctuation in VCO gain accompanying selection of the frequency band. However, the circuit arrangement that strongly influences the high-frequency characteristic is complicated, e.g., the number of variable capacitance elements and number of changeover capacitance elements increase. Problems that arise are an increase in area occupied and diminished design accuracy.

In accordance with the technique disclosed in Patent Document 2, it is possible to suppress a fluctuation in overall loop gain accompanying selection of the frequency band. However, the method of compensating for VCO gain fluctuation by the characteristic of another block still has problems, such as difficulty in terms of loop design and a decline in the universality of the VCO. In addition, a complicated circuit arrangement is required in order to realize the voltage adjusting circuit, and problems arise in terms of power consumption and chip area.

In accordance with the voltage-controlled oscillator disclosed in Patent Document 3, a state in which a fixed capacitance that is independent of the control voltage VCONT is connected to the resonance circuit is attained in a case where the switching elements S101, S102 do not select the control voltage VCONT. Accordingly, in addition to a complicated circuit arrangement, the center-frequency control range is limited owing to a fixed capacitance that is always added on. Consequently, if an attempt is made to realize the same center-frequency control range, it becomes necessary to use larger variable capacitance elements and the scale of the circuitry is likely to increase.

It is an object of the present invention to provide a voltage-controlled oscillator of simple construction and reduced scale.

According to a first aspect of the present invention, there is provided a voltage-controlled oscillator having an inductor and a group of variable capacitance elements forming a resonance circuit. The group of variable capacitance elements includes first and second variable capacitance elements connectable in parallel and having mutually different absolute values of a ratio of control-voltage sensitivity to capacitance. The first and second variable capacitance elements both have a first end supplied with a control voltage for controlling resonance frequency of the resonance circuit and have a second end selectively connected to the inductor by a band selection signal for deciding a band in which the resonance frequency exists.

In the voltage-controlled oscillator of the present invention, the first and second variable capacitance elements may have their second end connected to the inductor via a first switching element, wherein the first switching element can be turned on and off by the band selection signal.

In the voltage-controlled oscillator of the present invention, the first and second variable capacitance elements may have mutually different element sizes.

In the voltage-controlled oscillator of the present invention, the first and second variable capacitance elements may have mutually different polarities of the ratio of control-voltage sensitivity to capacitance.

In the voltage-controlled oscillator of the present invention, the first and second variable capacitance elements may have mutually identical polarities of the ratio of control-voltage sensitivity to capacitance.

In the voltage-controlled oscillator of the present invention, the group of variable capacitance elements may further include a first series circuit composed of a third variable capacitance element and a second switching element, wherein the third variable capacitance element has a first end supplied with the control voltage and a second end connected to the inductor via the second switching element, and the second switching element can be turned on and off by the band selection signal.

In the voltage-controlled oscillator of the present invention, the group of variable capacitance elements may further include a second series circuit composed of a fixed capacitance element and a third switching element, wherein the second series circuit has a first end connected to ground and a second end connected to the inductor, and the third switching element can be turned on and off by the band selection signal.

In the voltage-controlled oscillator of the present invention, differential oscillation signals may be capable of being output.

In the voltage-controlled oscillator of the present invention, a single-ended oscillation signal may be capable of being output.

A phase-locked loop circuit according to the present invention may use the above-described voltage-controlled oscillator.

A clock and data recovery circuit according to the present invention may use the above-described voltage-controlled oscillator.

The meritorious effects of the present invention are summarized as follows.

In accordance with the present invention, a voltage-controlled oscillator of simple construction and reduced scale is obtained.

Other features and advantages of the present invention will be apparent from the following description taken in conjunction with the accompanying drawings, in which like reference characters designate the same or similar parts throughout the figures thereof.

PREFERRED MODES

Figure 1:
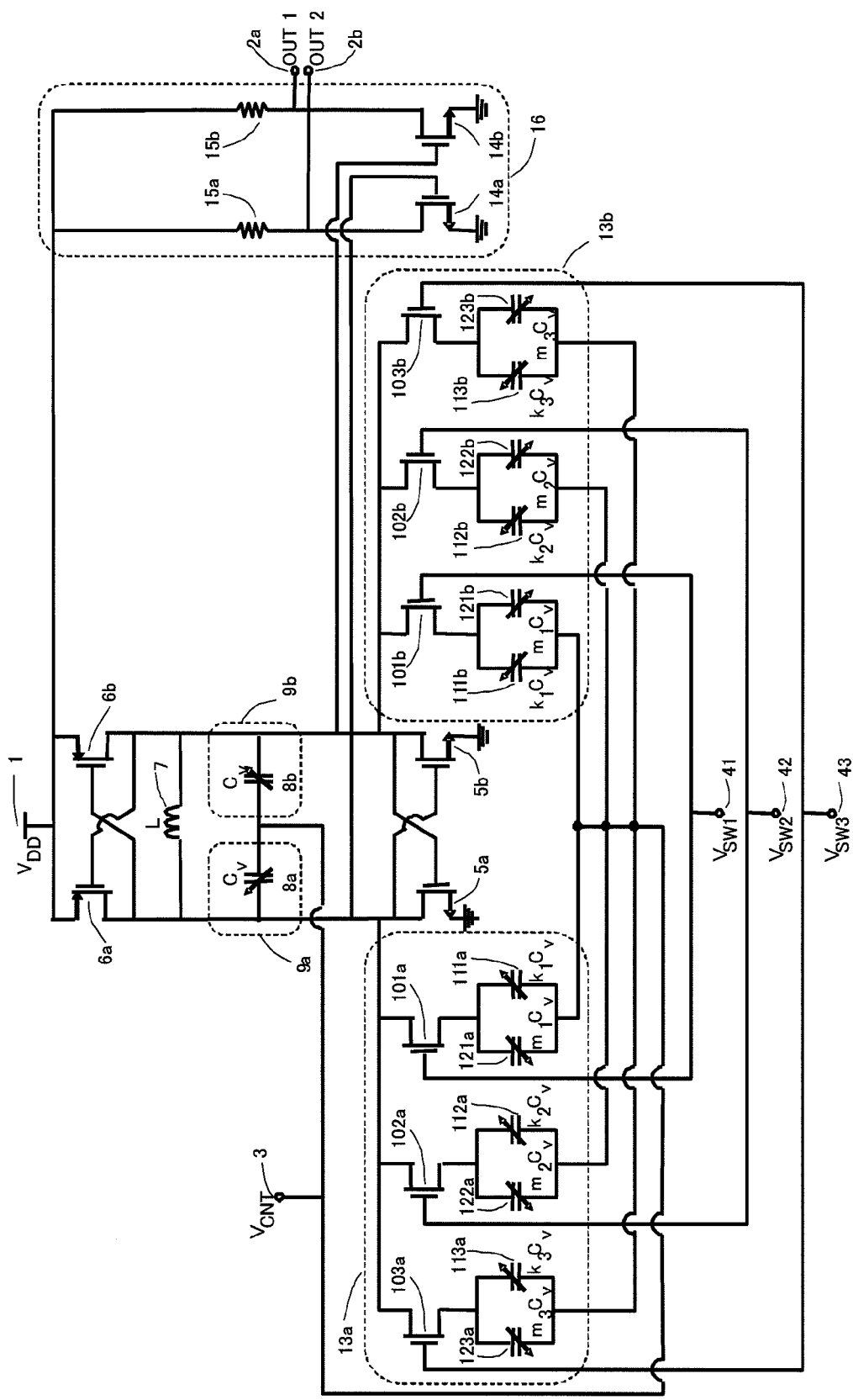
FIG. 1 is a circuit diagram of a voltage-controlled oscillator according to a first exemplary embodiment of the present invention.

A voltage-controlled oscillator according to the present invention is a multiband voltage-controlled oscillator having a first variable capacitance element (frequency varying means) to which a control voltage is applied and a separate second variable capacitance element (frequency varying means) and is equipped with a variable capacitance circuit capable of being controlled independently of the size of capacitance and voltage sensitivity. The control voltage is applied to a first terminal of the variable capacitance circuit and a switching element is connected to a second terminal of the variable capacitance circuit.

The switching element is controlled by a control signal of the second variable capacitance element. One or more circuits each formed by the variable capacitance circuit and switching element are connected together.

A multiband voltage-controlled oscillator has a first variable capacitance element to which a control voltage is applied and separate second variable capacitance element and is equipped with a pair of variable capacitance elements in which two variable capacitance elements are connected in parallel such that their polarities are opposite each other. The control voltage is applied to a first terminal of the pair of variable capacitance elements and a switching element is connected to a second terminal of the pair of variable capacitance elements. The switching element is controlled by a control signal of the second variable capacitance element. One or more circuits each formed by the pair of variable capacitance elements and switching element may be connected together.

In the voltage-controlled oscillator, the element sizes of the variable capacitance elements that form the pair of variable capacitance elements may be different from each other.

In the voltage-controlled oscillator, some (part) of the pairs of variable capacitance elements may be replaced with single variable capacitance element(s).

In the voltage-controlled oscillator, some of the circuits each formed by the pair of variable capacitance elements and switching element may be replaced with circuits formed by a fixed capacitance element and a switching element.

In the voltage-controlled oscillator, some of the circuits each formed by the pair of variable capacitance elements and switching element may be replaced with circuits formed by a single variable capacitance element and a switching element and circuits formed by a fixed capacitance element and a switching element.

In the voltage-controlled oscillator, instead of the pair of variable capacitance elements, three or more variable capacitance elements including at least one of opposite polarities may be used.

Another voltage-controlled oscillator according to the present invention is a multiband voltage-controlled oscillator having a first variable capacitance element to which a control voltage is applied and separate second variable capacitance element. One or more circuits each formed by a variable capacitance element and a switching element are connected together. The control voltage is applied to a first terminal of the variable capacitance element and the switching element is connected to a second terminal of the variable capacitance element. The switching element is controlled by a control signal of the second variable capacitance element. The voltage-controlled oscillator may include a mixture of the variable capacitance elements of differently oriented polarities connected together.

A multiband voltage-controlled oscillator has a first variable capacitance element to which a control voltage is applied and separate second variable capacitance element. One or more circuits each formed by a variable capacitance element and a switching element are connected together, and one or more circuits separate from these circuits and each formed by a fixed capacitance element and a switching element are connected together. The control voltage is applied to a first terminal of the variable capacitance element and the switching element is connected to a second terminal of the variable capacitance element. The switching element is controlled by a control signal of the second variable capacitance element. The voltage-controlled oscillator may include a mixture of the variable capacitance elements of differently oriented polarities connected together.

In the voltage-controlled oscillator, some (part) of the circuits each formed by a pair of variable capacitance elements and switching element may be replaced with circuit(s) formed by a fixed capacitance element and a switching element.

A multiband voltage-controlled oscillator has a first variable capacitance element to which a control voltage is applied and separate second variable capacitance element. One or more circuits each formed by a variable capacitance element and a switching element are connected together, and one or more circuits separate from these circuits and each formed by a fixed capacitance element and a switching element are connected together. The control voltage is applied to a first terminal of the variable capacitance element and the switching element is connected to a second terminal of the variable capacitance element. The switching element is controlled by a control signal of the second variable capacitance element.

The variable capacitance element may be connected with its polarity aligned with the polarity of the first variable capacitance element.

A multiband voltage-controlled oscillator has a first variable capacitance element to which a control voltage is applied and separate second variable capacitance element and includes a pair of variable capacitance elements in which two types of variable capacitance elements having different capacitance voltage sensitivities per unit capacitance are connected in parallel. The control voltage is applied to a first terminal of the pair of variable capacitance elements and the switching element is connected to a second terminal of the pair of variable capacitance elements. The switching element is controlled by a control signal of the second variable capacitance element. One or more of the circuits each formed by the pair of variable capacitance elements and switching element can be connected together.

A multiband voltage-controlled oscillator has a first variable capacitance element to which a control voltage is applied and separate second variable capacitance element and includes a pair of variable capacitance elements in which two types of variable capacitance elements having different capacitance voltage sensitivities per unit capacitance are connected in parallel such that their polarities are oriented opposite each other. The control voltage is applied to a first terminal of the pair of variable capacitance elements and the switching element is connected to a second terminal of the pair of variable capacitance elements. The switching element is controlled by a control signal of the second variable capacitance element. One or more of the circuits each formed by the pair of variable capacitance elements and switching element can be connected together.

In the voltage-controlled oscillator, the pair of variable capacitance elements may just as well be three or more variable capacitance elements including at least one having different voltage sensitivities per unit capacitance.

In the voltage-controlled oscillator, the first variable capacitance element to which the control voltage is applied need not be provided.

In the voltage-controlled oscillator, a switching element included in the second variable capacitance element may be constituted by a transistor.

The above-described voltage-controlled oscillator may be a differential voltage-controlled oscillator or a single-ended voltage-controlled oscillator.

The above-described voltage-controlled oscillator may be used in a phase-locked loop of the present invention.

The above-described voltage-controlled oscillator may be used in a clock and data recovery circuit of the present invention.

In such a voltage-controlled oscillator having two variable capacitance elements (frequency converting means) for performing multiband operation, a pair of variable capacitance elements in which two variable capacitance elements controlled by a control voltage are connected in parallel such that their polarities are opposite each other is formed and the pair is connected and disconnected by a switch. Capacitance values and voltage sensitivities of the pair of variable capacitance elements are controllable independently each other. Accordingly, control width of the center frequency and the VCO gain are controllable independently. Utilizing these properties provides the effect of suppressing a fluctuation in the VCO gain at control of center frequency in a multiband VCO.

Further, the suppression of VCO gain fluctuation can be achieved with almost no attendant increase in complexity of the circuit arrangement. Accordingly, the invention is particularly effective when applied to the ultra-high frequency band such as the millimeter wave band. Furthermore, this contributes to a reduction in circuit size since a fixed capacitor element is not used or because the number thereof used can be reduced.

Exemplary embodiments of the present invention will now be described in detail with reference to the drawings.

First Exemplary Embodiment

FIG. 1 is a circuit diagram of a voltage-controlled oscillator according to a first exemplary embodiment of the present invention. The voltage-controlled oscillator shown in FIG. 1 includes power supply terminal 1, output terminals 2a, 2b, loop control terminal 3, frequency-band selection terminals 41, 42, 43, NMOS transistors 5a, 5b with their respective drains and gates cross-coupled, PMOS transistors 6a, 6b with their respective drains and gates cross-coupled, inductor 7, variable capacitance elements 8a, 8b, switched-capacitance bank units 13a, 13b and output buffer 16. The portions constituted by the variable capacitance elements 8a, 8b are referred to as variable capacitance units 9a, 9b, respectively.

The NMOS transistor 5a has a source connected to ground and a drain connected to a first end of the switched-capacitance bank unit 13a, a first input end of the output buffer 16, a first end of the variable capacitance element 8a, a first end of the inductor 7 and a drain of the PMOS transistor 6a. The NMOS transistor 5b has a source connected to ground and a drain connected to a first end of the switched-capacitance bank unit 13b, a second input end of the output buffer 16, a first end of the variable capacitance element 8b, a second end of the inductor 7 and a drain of the PMOS transistor 6b. The sources of the PMOS transistors 6a, 6b are connected to the power supply terminal 1. A second end of the switched-capacitance bank unit 13a, a second end of the switched-capacitance bank unit 13b, a second end of variable capacitance element 8a and a second end of the variable capacitance element 8b are connected in common with the loop control terminal 3.

The switched-capacitance bank unit 13a has variable capacitance elements 111a, 112a, 113a, 121a, 122a, 123a and transistors 101a, 102a, 103a, which are switching elements. The switched-capacitance bank unit 13b has variable capacitance elements 111b, 112b, 113b, 121b, 122b, 123b and transistors 101b, 102b, 103b, which are switching elements. First ends of respective ones of the transistors 101a, 102a, 103a in common constitute the one end of the switched-capacitance bank unit 13a. First ends of respective ones of the transistors 101b, 102b, 103b in common constitute the one end of the switched-capacitance bank unit 13b. That is, second ends of respective ones of the transistors 10ia (i=1, 2, 3) constitute the second end of the switched-capacitance bank unit 13a via respective ones of the parallel-connected variable capacitance elements 11ia, 12ia. Second ends of respective ones of the transistors 10ib (i=1, 2, 3) constitute the second end of the switched-capacitance bank unit 13b via respective ones of the parallel-connected variable capacitance elements 11ib, 12ib.

The output buffer 16 has output transistors 14a, 14b and output resistors 15a, 15b. The output transistor 14a has a source connected to ground, a gate serving as a first input terminal of the output buffer 16 and a drain connected to the output terminal 2b and to the power supply terminal 1 via the output resistor 15a. The output transistor 14b has a source connected to ground, a gate serving as a second input terminal of the output buffer 16 and a drain connected to the output terminal 2a and to the power supply terminal 1 via the output resistor 15b.

The variable capacitance elements 11ia and 12ia (i=1, 2, 3), which are connected in parallel in directions such that their polarities are opposite each other, form a pair of variable capacitance elements. Similarly, the variable capacitance elements 11ib and 12ib (i=1, 2, 3), which are also connected in parallel in directions such that their polarities are opposite each other, form a pair of variable capacitance elements. The orientation of the variable capacitance elements 11ia, 11ib (i=1, 2, 3) shall be referred to as the "forward polarity" orientation in the sense that this orientation is a polarity orientation the same as that of the variable capacitance elements 8a, 8b (the polarities of the terminals to which the loop control voltage is applied are the same), and the orientation of the variable capacitance elements 12ia, 12ib (i=1, 2, 3) shall be referred to as the "reverse polarity" orientation in the sense that this orientation is a polarity orientation that is opposite that of the variable capacitance elements 8a, 8b.

The capacitance value of the variable capacitance elements 8a, 8b is expressed by $C_V(V_{CNT})$ as a function of the loop control voltage $V_{CNT}$ of the loop control terminal 3. The capacitance value of the variable capacitance elements 11ia, 11ib (i=1, 2, 3) is expressed by $k_i C_V(V_{CNT})$ as a multiple $k_i$ of the capacitance value of the variable capacitance elements 8a, 8b. In general, the size of the variable capacitance elements 11ia, 11ib (i=1, 2, 3) is $k_i$ times the size of the variable capacitance elements 8a, 8b. The values of $k_i$ (i=1, 2, 3) usually are set to values that differ from one another. Similarly, the capacitance value of the variable capacitance elements 12ia, 12ib (i=1, 2, 3) is expressed by $m_i C_V(V_{CNT})$ as a multiple $m_i$ of the capacitance value of the variable capacitance elements 8a, 8b. In general, the size of the variable capacitance elements 12ia, 12ib (i=1, 2, 3) is $m_i$ times the size of the variable capacitance elements 8a, 8b. The values of $m_i$ (i=1, 2, 3) usually are set to values that differ from one another. Further, $k_i$ and $m_i$ (i=1, 2, 3) are set to values that differ from each other.

The pair of variable capacitance elements formed by the variable capacitance elements 11ia and 12ia (i=1, 2, 3) and the pair of variable capacitance elements formed by the variable capacitance elements 11ib and 12ib (i=1, 2, 3) are electrically disconnected from or connected to the VCO by changeover of band selection signals VSW1, VSW2, VSW3 applied to the frequency-band selection terminals 41, 42, 43, respectively. That is, the frequency band containing the resonance frequency of the resonance circuit formed by the inductor 7 and group of variable capacitance elements (variable capacitance units 9a, 9b and switched-capacitance bank units 13a, 13b) is changed over by the band selection signals VSW1, VSW2, VSW3. It should be noted that although the example of FIG. 1 illustrates a case where the number of bits constituting the band selection signals VSW1, VSW2, VSW3 is three, the number of bits is set to any number as required.

The basic operation of this voltage-controlled oscillator will be described next. The cross-coupled portion formed by the NMOS transistors 5a, 5b and the cross-coupled portion formed by the PMOS transistors 6a, 6b produce negative resistance. Owing to the fact that this negative resistance compensates for loss, which are generated in other portions of the circuit, at the oscillation frequency, a sustained oscillatory operation is realized.

The output buffer 16 functions to set the output level and output amplitude to suitable values and to shield the oscillation frequency of the voltage-controlled oscillator from the effects of external circuitry. However, it should be noted that the output buffer circuit may have any configuration and that the provision of the buffer circuit is not a requisite condition of the present invention.

Figure 2:
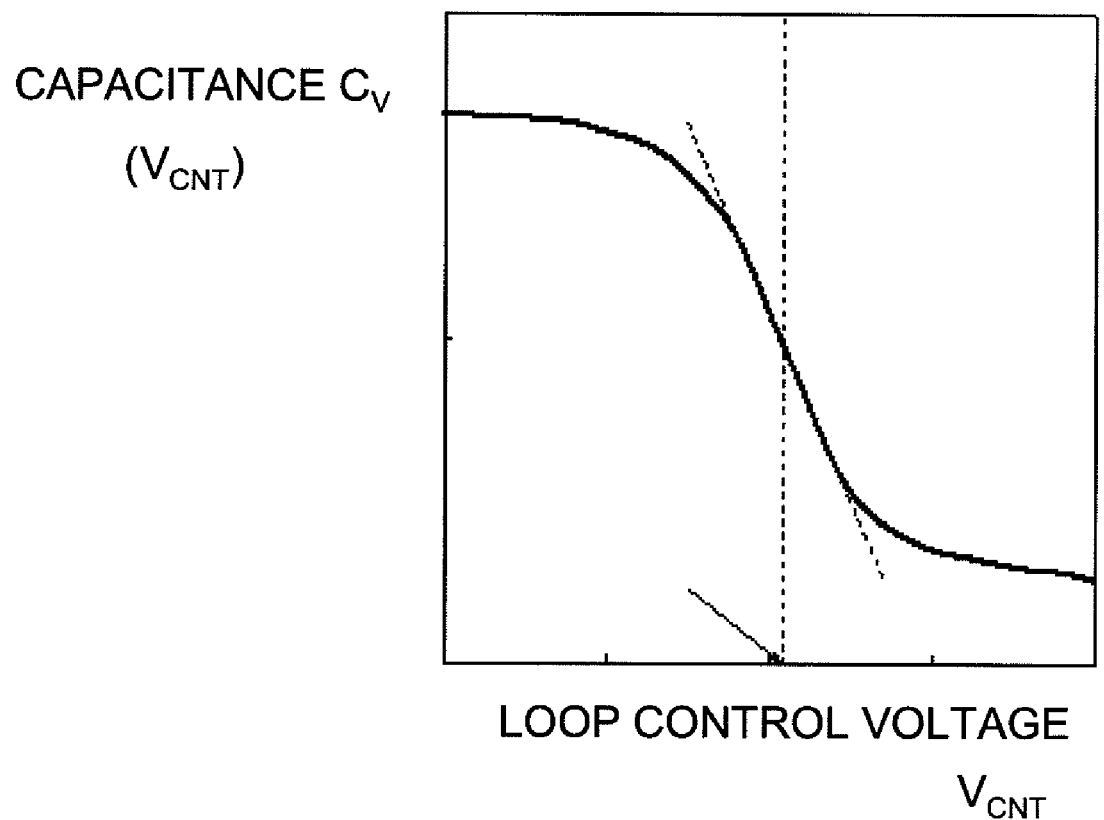
FIG. 2 is a diagram illustrating a capacitance vs. control voltage characteristic of a variable capacitance element.

The capacitance vs. control voltage characteristic (C-V characteristic) of the variable capacitance elements will now be described. FIG. 2 illustrates an example of the C-V characteristic of an accumulation-mode varactor used as a variable capacitance element in a CMOS (Complementary Metal Oxide Semiconductor). As illustrated in FIG. 2, the variable capacitance characteristic $C_V(V_{CNT})$ is made symmetrical with respect to center voltage $V_0$ of the loop control voltage $V_{CNT}$ by setting the center voltage $V_0$ to a suitable value. In the description that follows, a case where the variable capacitance characteristic $C_V(V_{CNT})$ has a symmetrical characteristic with respect to the center voltage $V_0$ will be described. However, this is an assumption for simplifying the discussion and is not a requisite condition of the present invention. Accordingly, the variable capacitance elements used are not necessarily limited to those described above.

Figure 3:
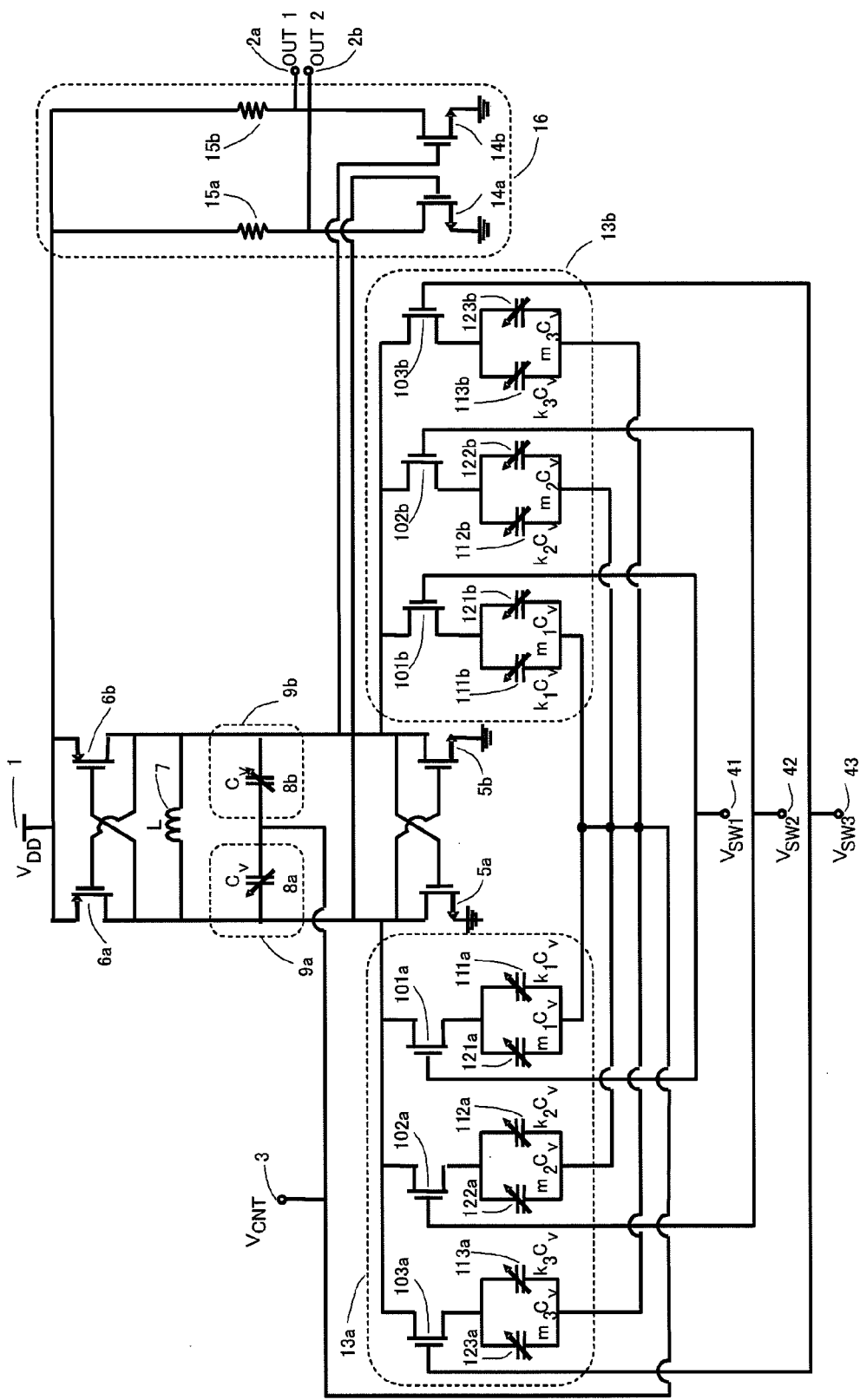
FIG. 3 is a supplementary circuit diagram for describing operation of the circuit shown in FIG. 1.
Figure 4:
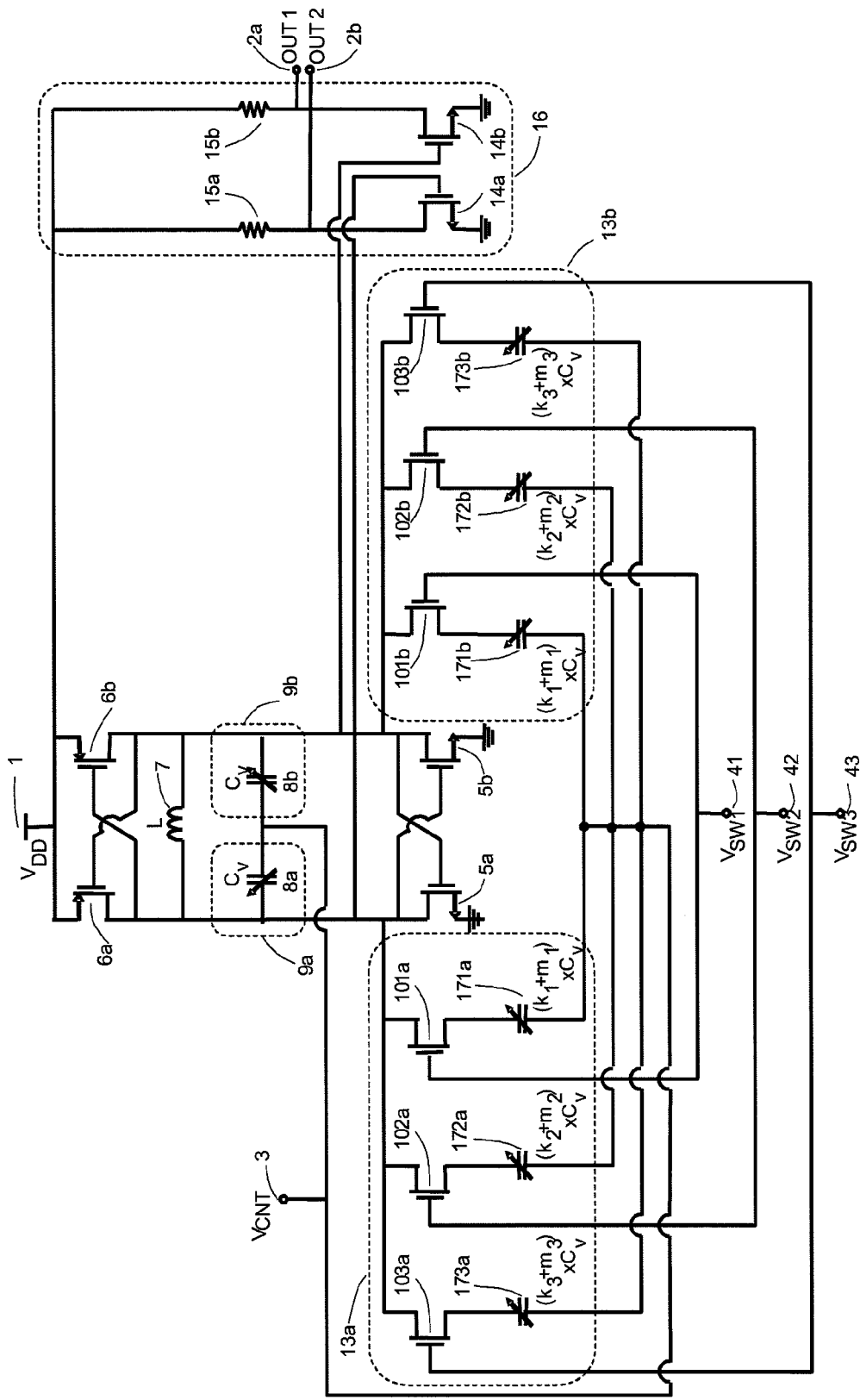
FIG. 4 is a second supplementary circuit diagram for describing operation of the circuit shown in FIG. 1.

In order to describe the detailed operation and effects of the circuit shown in FIG. 1, the operation of the circuit shown in FIG. 3 will be described first. Whereas each pair of variable capacitance elements in the circuit of FIG. 1 is composed of a parallel connection of variable capacitance elements whose polarities are oppositely oriented, each pair of variable capacitance elements in the circuit of FIG. 3 is composed of a parallel connection of variable capacitance elements whose polarities have the same orientation. The circuit of FIG. 3 is equivalent to that obtained by replacing each pair of variable capacitance elements with a single variable capacitance element, as shown in FIG. 4. That is, the variable capacitance elements 11ia and 12ia (i=1, 2, 3) are represented by a variable capacitance element 17ia, and the variable capacitance elements 11ib and 12ib (i=1, 2, 3) are represented by a variable capacitance element 17ib.

Accordingly, oscillation frequency f of the voltage-controlled oscillator shown in FIG. 3 is expressed approximately by the following equation:

$$f(v_{CNT}) = \frac{1}{2\pi} \frac{1}{\sqrt{\left(\frac{L}{2}\right)\left[C_f + C_v(v_{CNT}) + \sum_{i=1}^{n} \Delta_i(k_i + m_i)C_v(v_{CNT})\right]}} \quad (3)$$

Here n represents the number of bits for band selection, and n=3 holds in the example of FIG. 3. Further, $C_f$ represents the parasitic capacitance component of portions other than the variable capacitance units 9a, 9b and switched-capacitance bank units 13a, 13b, i.e., of the cross-coupled transistors 5a, 5b, 6a, 6b, etc. Further, $\Delta_i$ is a variable that takes on two values; $\Delta_i=1$ holds when band selection signal VSWi is at the high level and $\Delta_i=0$ holds when band selection signal VSWi is at the low level. (i=1, 2, ... n).

The frequency $f(V_{CNT})$ that prevails when the loop control voltage $V_{CNT}$ is the center voltage $V_0$ is referred to as the "center frequency". The center frequency is given by the following equation:

$$f(v_{CNT} = v_0) = \frac{1}{2\pi} \frac{1}{\sqrt{\left(\frac{L}{2}\right)\left[\begin{array}{c} C_f + C_v(v_{CNT} = v_0) + \\ \sum_{i=1}^{n} \Delta_i(k_i + m_i)C_v(v_{CNT} = v_0) \end{array}\right]}} \quad (4)$$

The center frequency can be varied discretely by changing the value of the band selection signal VSWi (i=1, 2, . . . , n), thereby making multiband operation possible.

The VCO gain in this case is as follows:

$$\left.\frac{\partial f}{\partial v_{CNT}}\right|_{v_{CNT}=v_0} = -\frac{1}{4\pi\sqrt{\frac{L}{2}}} \frac{1 + \sum_{i=1}^{n} \Delta_i(k_i + m_i)}{\left[C_f + C_v(v_{CNT} = v_0) + \sum_{i=1}^{n} \Delta_i(k_i + m_i) C_v(v_{CNT} = v_0)\right]^{\frac{3}{2}}} \left.\frac{\partial C_v}{\partial v_{CNT}}\right|_{v_{CNT}=v_0} \quad (5)$$

Accordingly, if the following equation:

$$\frac{1 + \sum_{i=1}^{n} \Delta_i(k_i + m_i)}{\left[C_f + C_v(v_{CNT} = v_0) + \sum_{i=1}^{n} \Delta_i(k_i + m_i) C_v(v_{CNT} = v_0)\right]^{\frac{3}{2}}} = \frac{1}{[C_f + C_v(v_{CNT} = v_0)]^{\frac{3}{2}}} \quad (6)$$

is satisfied for all switch states ($2^n$ in number, eight in case of three bits), then VCO gain fluctuation will be suppressed completely. Whether or not a solution $k_i + m_i > 0$ (i=1, 2, . . . , n) that satisfies Equation (6) exists is decided by conditions (the ratio of $C_f$ to $C_v$). However, even in a case where such a solution exists, the value of ($k_i + m_i$) is by definition a quantity that decides the amount of change in center frequency, which is a quantity that should be determined from the required performance. In general, therefore, with the circuit shown in FIG. 3, it is difficult to suppress VCO gain fluctuation at the time of a changeover of center frequency while taking the required performance into consideration.

By contrast, the oscillation frequency of the voltage-controlled oscillator shown in FIG. 1 is expressed approximately by the following equation:

$$f(v_{CNT}) = \frac{1}{2\pi} \frac{1}{\sqrt{\left(\frac{L}{2}\right)\left[C_f + C_v(v_{CNT}) + \sum_{i=1}^{n} \Delta_i k_i C_v(v_{CNT}) + \sum_{i=1}^{n} \Delta_i m_i C_v(2v_0 - v_{CNT})\right]}} \quad (7)$$

In the example of FIG. 1, n=3 as before.

The center frequency is given by the following equation:

$$f(v_{CNT} = v_0) = \frac{1}{2\pi} \frac{1}{\sqrt{\left(\frac{L}{2}\right)\left[C_f + C_v(v_{CNT} = v_0) + \sum_{i=1}^{n} \Delta_i(k_i + m_i) C_v(v_{CNT} = v_0)\right]}} \quad (8)$$

This agrees with Equation (4).

Further, the VCO gain is given by the following equation:

$$\left.\frac{\partial f}{\partial v_{CNT}}\right|_{v_{CNT}=v_0} = -\frac{1}{4\pi\sqrt{\frac{L}{2}}} \frac{1 + \sum_{i=1}^{n} \Delta_i(k_i - m_i)}{\left[C_f + C_v(v_{CNT} = v_0) + \sum_{i=1}^{n} \Delta_i(k_i + m_i) C_v(v_{CNT} = v_0)\right]^{\frac{3}{2}}} \left.\frac{\partial C_v}{\partial v_{CNT}}\right|_{v_{CNT}=v_0} \quad (9)$$

The term $(k_i + m_i)C_v(V_{CNT} = V_0)$ in the denominator of Equations (8) and (9) is a variable capacitance value appended by turning on an ith switch and decides the amount of change in center frequency. Accordingly, as mentioned earlier, the value of $(k_i + m_i)$ is a quantity that should be decided from the required performance. On the other hand, the term $(k_i - m_i)$ appears in the numerator of Equation (9). In Equation (5) that gives the VCO gain of the circuit shown in FIG. 3, this term is $(k_i + m_i)$. As a result, if the amount of change in center frequency is decided, so will the VCO gain as well, and any freedom in terms of setting VCO gain will be lost. With the circuit shown in FIG. 1, however, there is a degree of freedom in terms of setting VCO gain even if the amount of change in the center frequency is decided. That is, even if the value of $(k_i + m_i)$ is decided, the value of $(k_i - m_i)$ can be set freely to fall within the range of from $-|k_i + m_i|$ to $|k_i + m_i|$ when the circuit is designed. As a result, the VCO gain fluctuation that accompanies control of center frequency can be suppressed by utilizing the degree of freedom of VCO gain produced.

Figure 5:
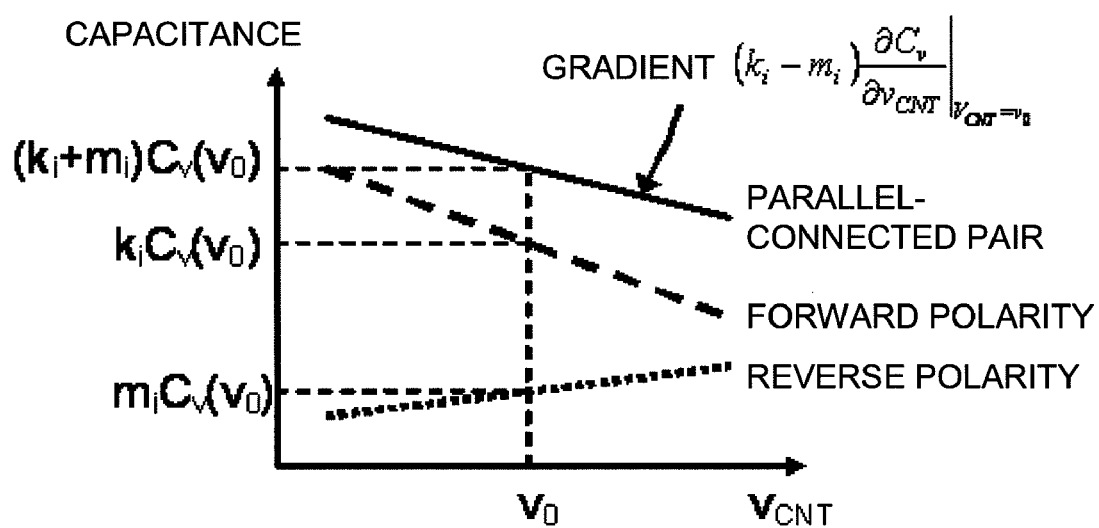
FIG. 5 is a diagram illustrating a capacitance vs. control voltage characteristic of a variable capacitance element.
Figure 6:
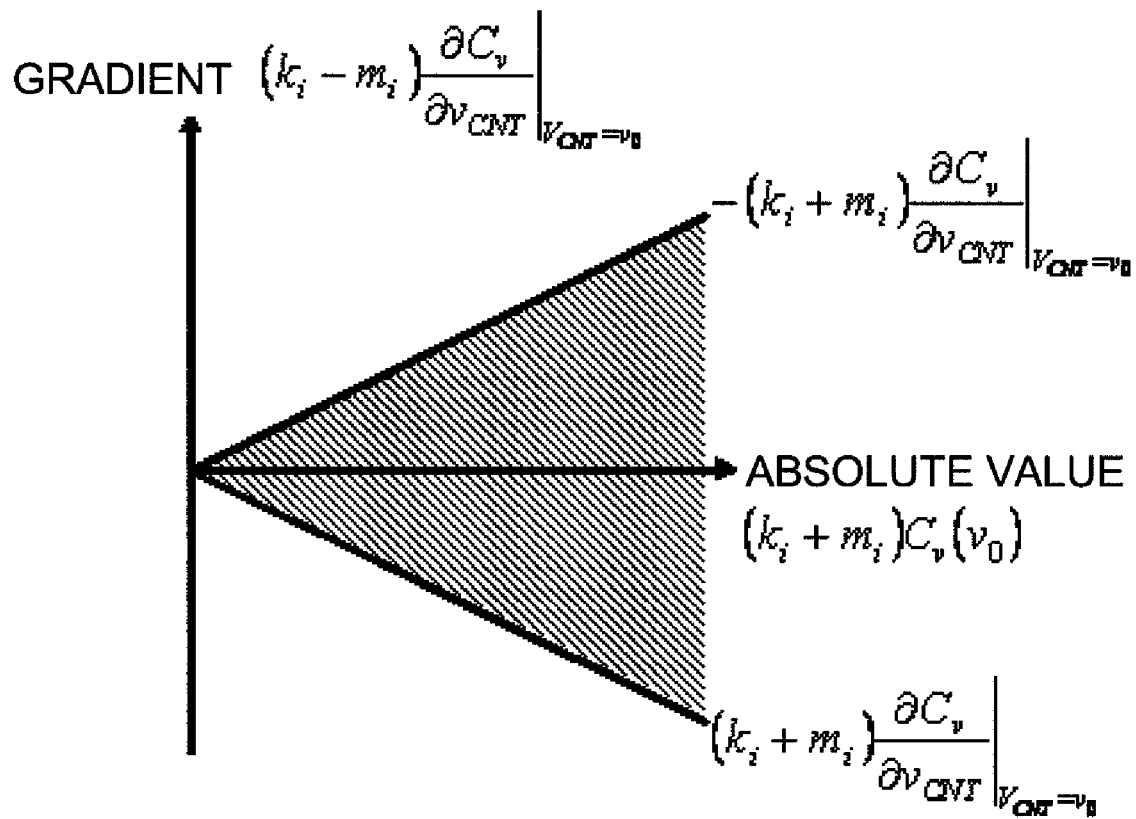
FIG. 6 is a diagram illustrating the relationship between the absolute value of a pair of variable capacitance elements at a center voltage and gradient with respect to control voltage in a first exemplary embodiment of the present invention.

The explanation rendered above will be discussed in further detail with reference to the drawings. FIG. 5 illustrates a capacitance vs. control voltage characteristic of a single pair of variable capacitance elements. The gradient(slope) (the coarse broken line) of the capacitance vs. control voltage characteristic of the variable capacitance element having the forward polarity is made less steep by the gradient (the fine broken line) of the capacitance vs. control voltage characteristic of the variable capacitance element having the reverse polarity, and the gradient (the solid line) of the capacitance vs. control voltage characteristic of the pair of variable capacitance elements is thus decided. By varying the distribution ratio between the size of the variable capacitance element having the forward polarity and the size of the variable capacitance element having the reverse polarity while holding the sum of the two constant, it is possible to control the gradient independently of the absolute value of the pair of variable capacitance elements at the center voltage. If the variable capacitance element having the reverse polarity is made larger, then it will be possible to reverse the sign of the overall gradient. FIG. 6 is a diagram illustrating the relationship between the absolute value of a pair of variable capacitance elements at a center voltage and gradient with respect to control voltage in this case. The gradient with respect to control voltage can be controlled within the range of the shaded area in FIG. 6 with respect to each absolute value of the pair of variable capacitance elements at the center voltage. This means that the VCO gain can be set freely within a certain range even if frequency range achieved by changing a switch setting has been decided.

Figure 7:
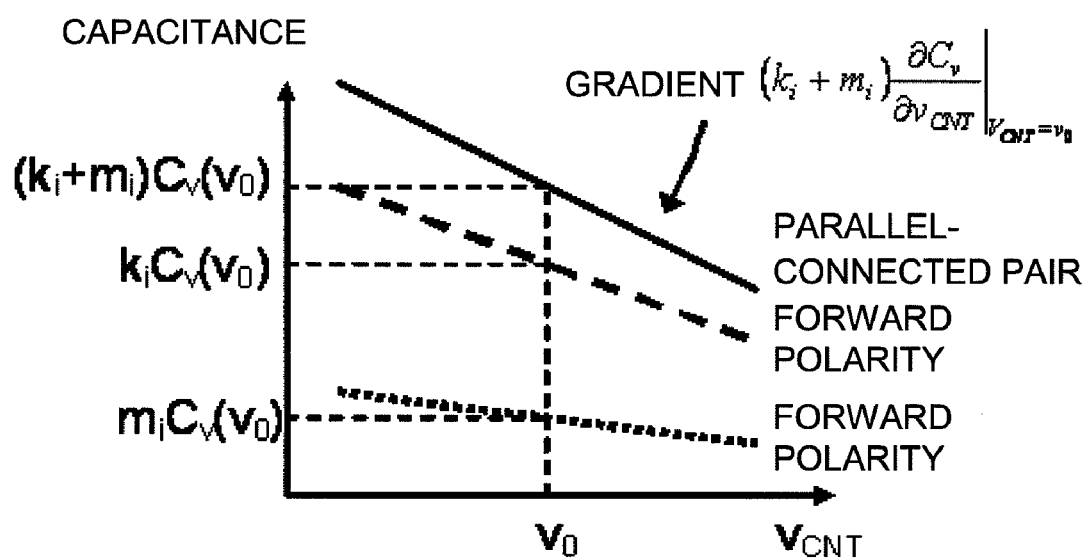
FIG. 7 is a diagram illustrating a capacitance vs. control voltage characteristic of a variable capacitance element.
Figure 8:
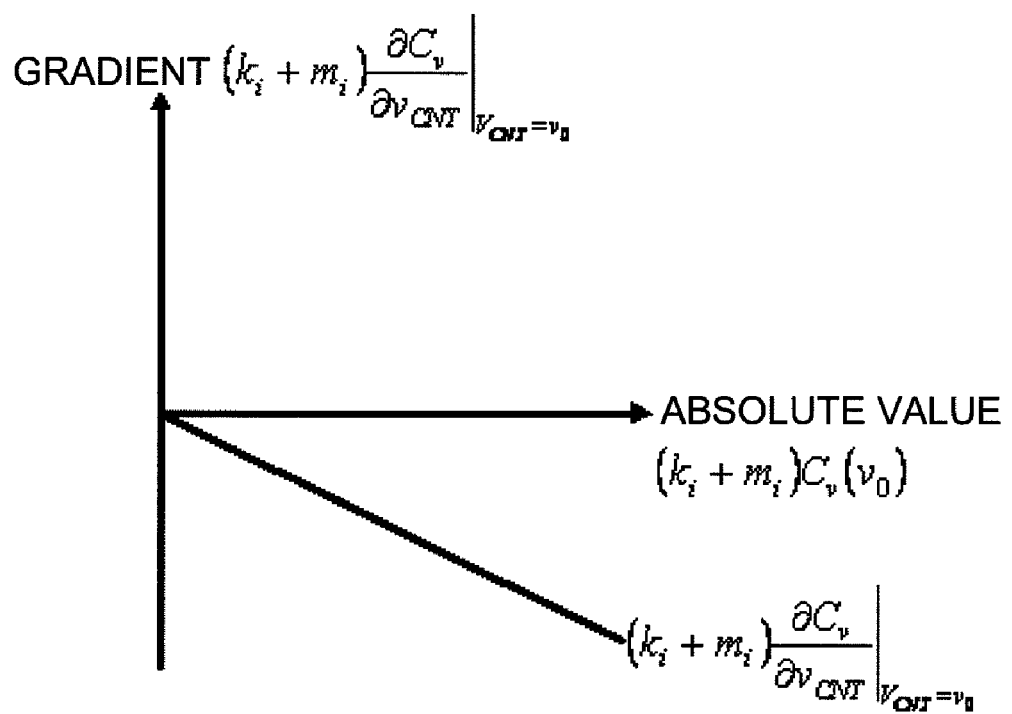
FIG. 8 is a second diagram illustrating the relationship between the absolute value of a pair of variable capacitance elements at a center voltage and gradient with respect to control voltage.

By contrast, FIG. 7 is a diagram illustrating a capacitance vs. control voltage characteristic of a pair of variable capacitance elements in the circuit shown in FIG. 3. A gradient (the coarse broken line) of the capacitance vs. control voltage characteristic of the variable capacitance element having the forward polarity and a gradient (the fine broken line) of the capacitance vs. control voltage characteristic of the variable capacitance element having the forward polarity are added together as is and a gradient (the solid line) of the capacitance vs. control voltage characteristic of the pair of variable capacitance elements is thus decided. If the sum of the size of a variable capacitance element having the forward polarity and the size of a variable capacitance element having the reverse polarity is decided, then the gradient of the capacitance—control voltage characteristic of the pair of variable capacitance elements is uniquely decided. FIG. 8 is a diagram illustrating the relationship between the absolute value of a pair of variable capacitance elements at a center voltage and gradient with respect to control voltage in this case. With regard to each absolute value of the pair of variable capacitance elements at the center voltage, the gradient with respect to control voltage is uniquely decided as a value on the straight line in FIG. 8. This means that if the width of frequency changeover achieved by a switch setting changeover has been decided, then the VCO gain will also be decided automatically.

Figure 9:
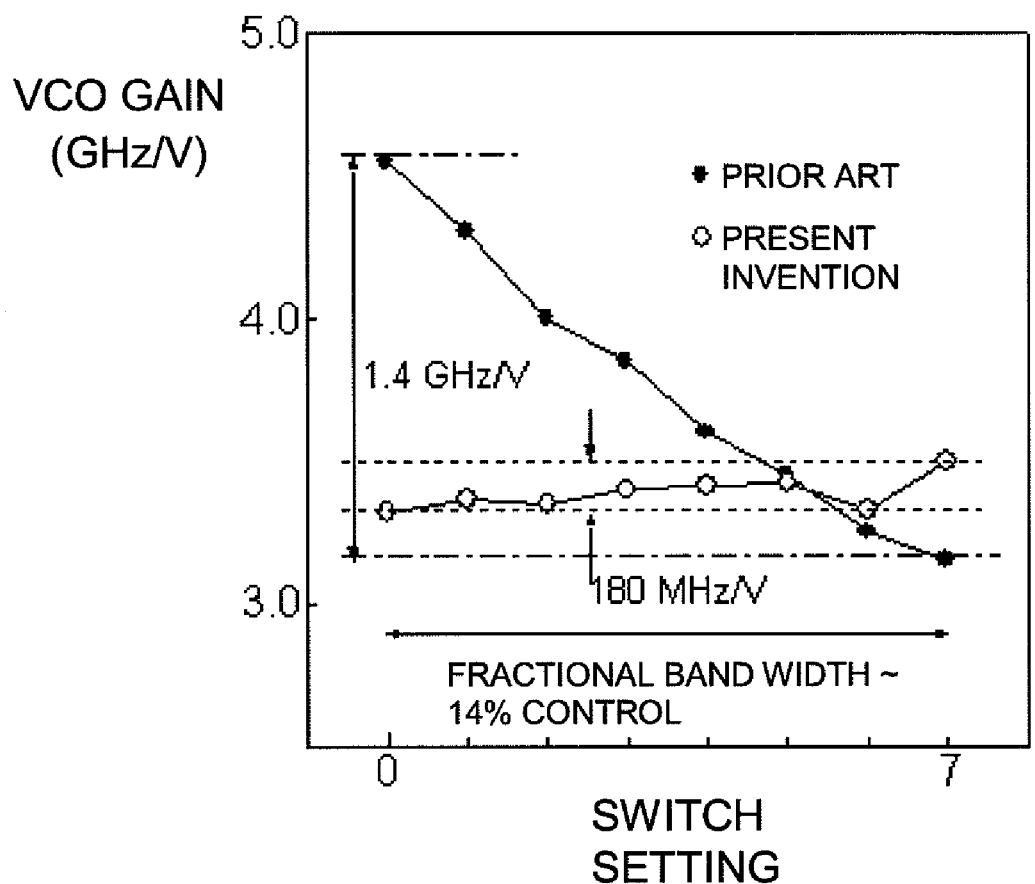
FIG. 9 is a diagram illustrating VCO gain fluctuation when center frequency is varied.
Figure 29:
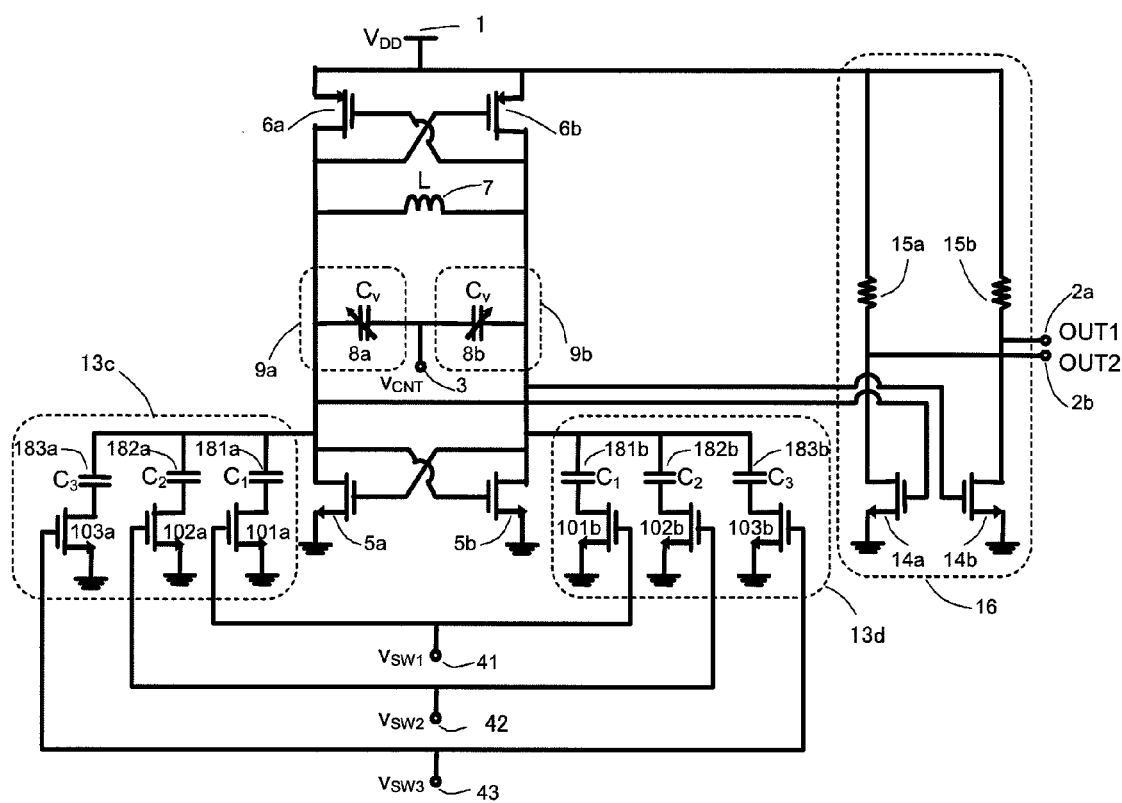
FIG. 29 is a circuit diagram illustrating a typical example of a voltage-controlled oscillator according to the related art.
Figure 30:
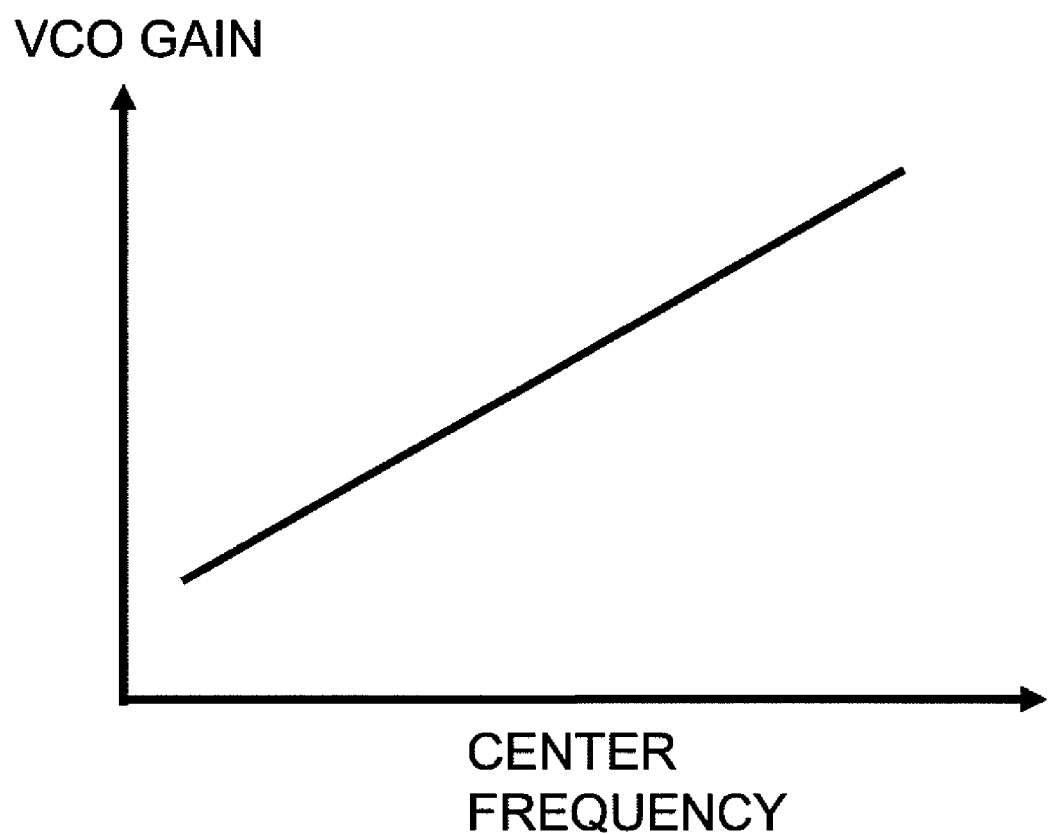
FIG. 30 is a diagram illustrating the relationship between VCO gain and center frequency in a VCO according to the related art.
Figure 31:
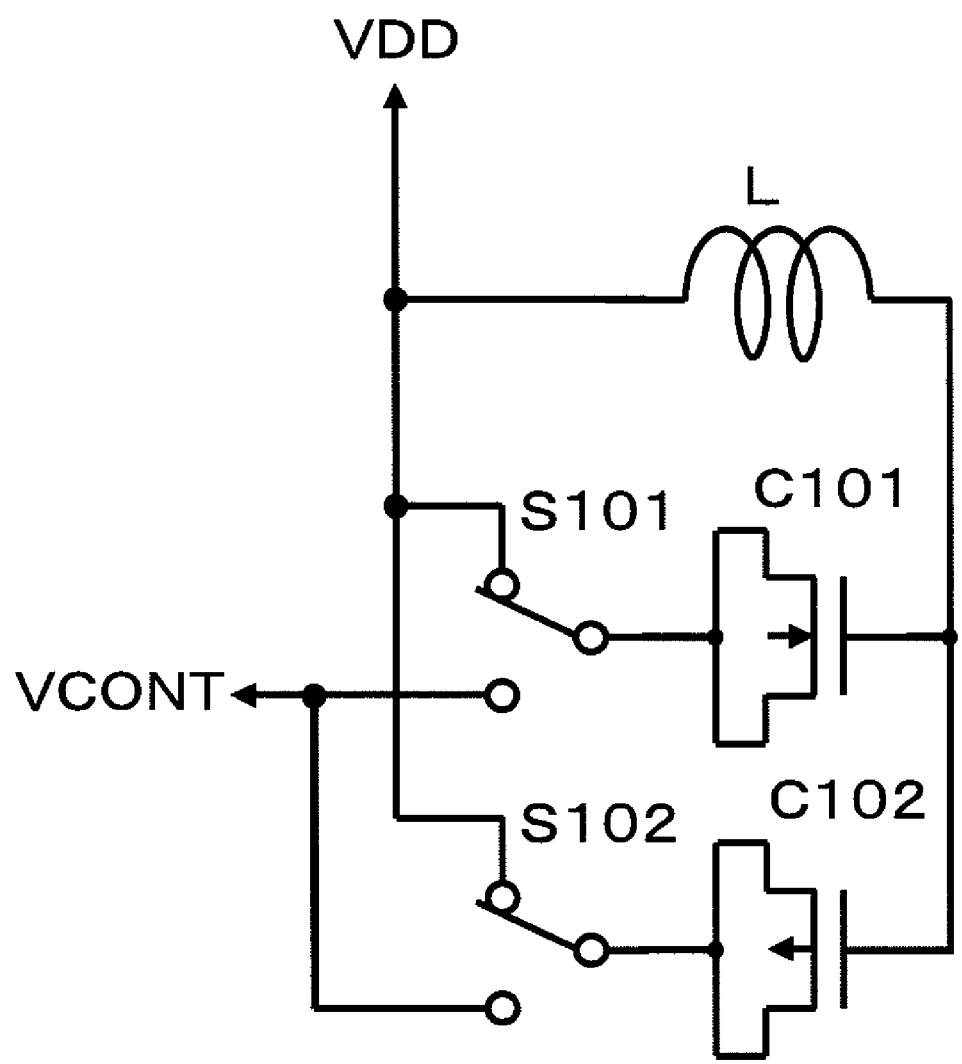
FIG. 31 is a diagram illustrating in detail a resonance circuit in a voltage-controlled oscillator according to Patent Document 3.

The effect of suppression of VCO gain fluctuation described above has been confirmed by circuit simulation. FIG. 9 is a diagram illustrating VCO gain fluctuation when center frequency is varied by changing over the setting of the band selection signal in eight states with regard to the circuit of the present invention (FIG. 1) and the circuit of the related art (FIG. 29) as a reference. The simulation was conducted by the harmonic balance method. Application to a 40-Gbps optical communication system was assumed and design was implemented in such a manner that the center-frequency range covered 39.8 GHz (OC-768), 43.01 GHz (OTU-3) and 44.57 GHz (10 GbE×4). With the present invention in contrast with the related art, it will be understood that the VCO gain fluctuation that accompanies control of center frequency can be suppressed to ⅛ in comparison with the related art.

As described above, the multiband VCO of this exemplary embodiment makes it possible to suppress a fluctuation in VCO gain when center frequency is controlled. Further, in accordance with this exemplary embodiment, this effect can be achieved with almost no attendant increase in complexity of the circuit arrangement. Accordingly, the invention is particularly effective when applied to the ultra-high frequency band such as the millimeter wave band. Furthermore, this contributes to a reduction in circuit size since a fixed capacitor element is not used or because the number thereof used can be reduced.

Second Exemplary Embodiment

Figure 10:
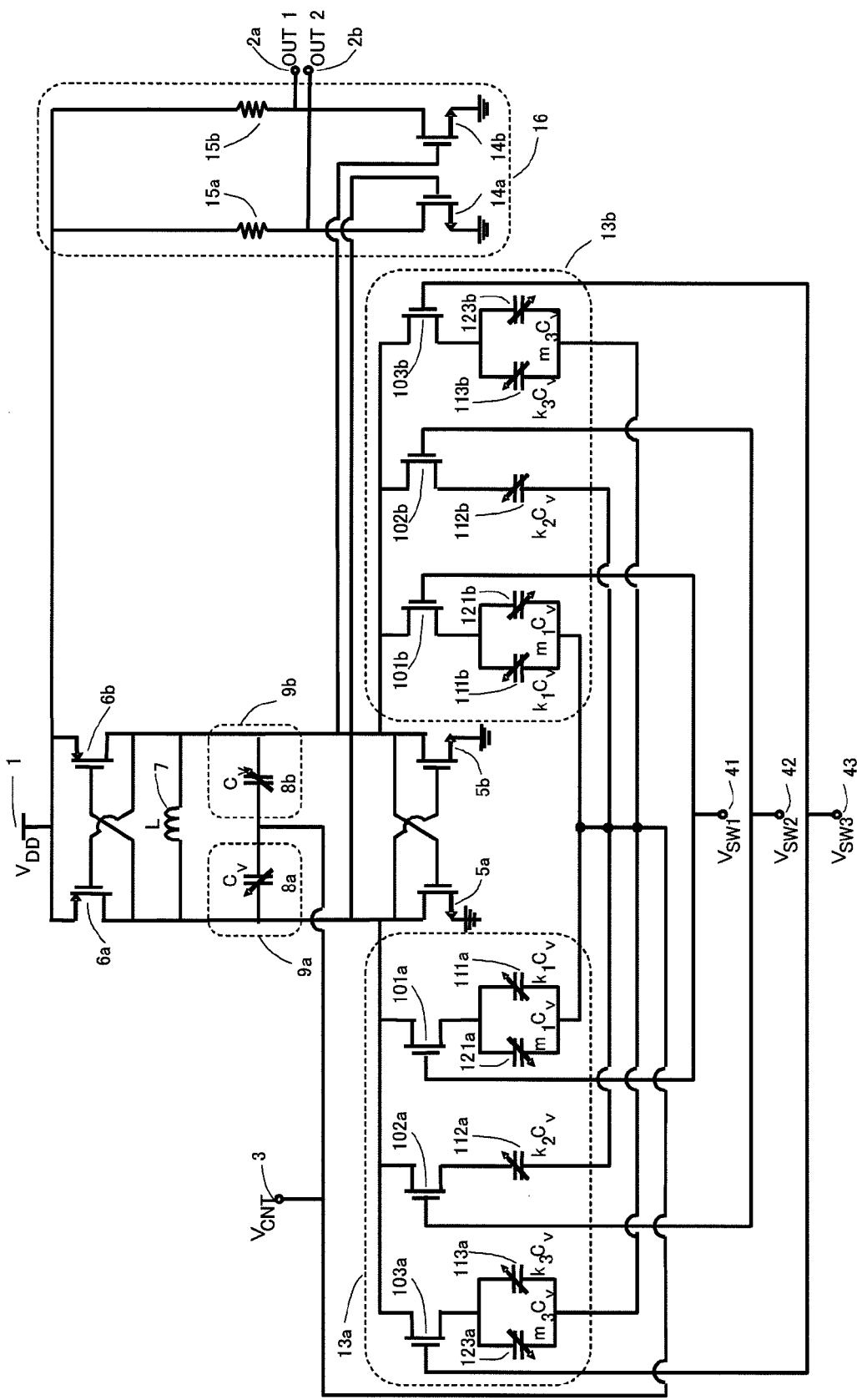
FIG. 10 is a circuit diagram of a voltage-controlled oscillator according to a second exemplary embodiment of the present invention.

FIG. 10 is a circuit diagram of a voltage-controlled oscillator according to a second exemplary embodiment of the present invention. Components identical with those of the voltage-controlled oscillator illustrated in FIG. 1 are designated by like reference characters and need not be described again. In the voltage-controlled oscillator of the first exemplary embodiment, all bits correspond to pairs of variable capacitance elements. However, if the VCO gain fluctuation can be held within a desired range, it is possible to adopt an arrangement in which some bits correspond to single variable capacitance elements. The circuit shown in FIG. 10 is an example in which the pairs of variable capacitance elements corresponding to the second bit of the three bits are formed by respective single variable capacitance elements 112a, 112b.

Third Exemplary Embodiment

Figure 11:
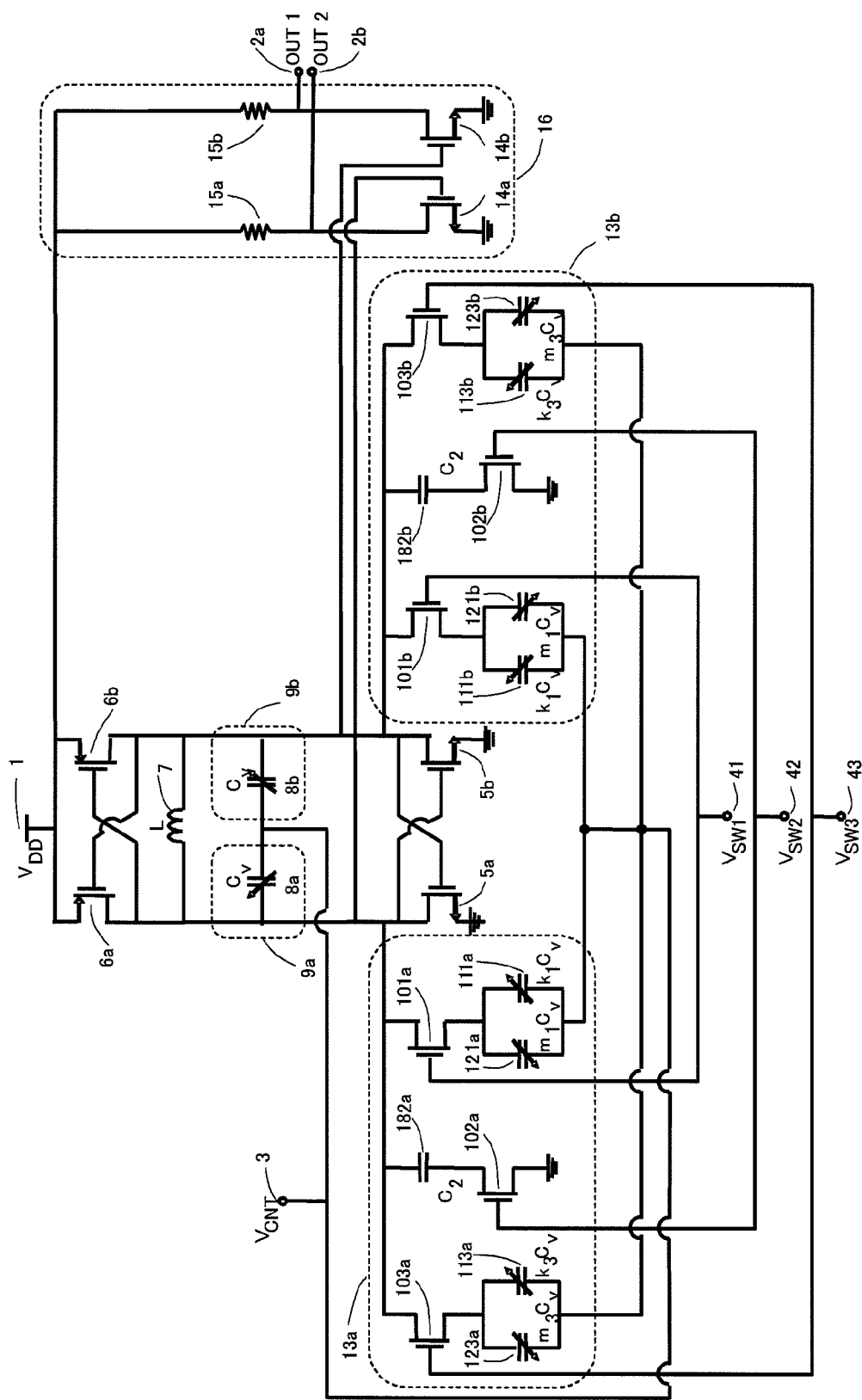
FIG. 11 is a circuit diagram of a voltage-controlled oscillator according to a third exemplary embodiment of the present invention.

FIG. 11 is a circuit diagram of a voltage-controlled oscillator according to a third exemplary embodiment of the present invention. Components identical with those of the voltage-controlled oscillator illustrated in FIG. 1 are designated by like reference characters and need not be described again. In the voltage-controlled oscillator of the first exemplary embodiment, pairs of variable capacitance elements are formed by all bits. However, if the VCO gain fluctuation can be held within a desired range, it is possible to form some of the bits by fixed capacitance elements. The circuit shown in FIG. 11 is an example in which the pairs of variable capacitance elements corresponding to the second bit of the three bits are formed by respective single fixed capacitance elements 182a, 182b.

Fourth Exemplary Embodiment

Figure 12:
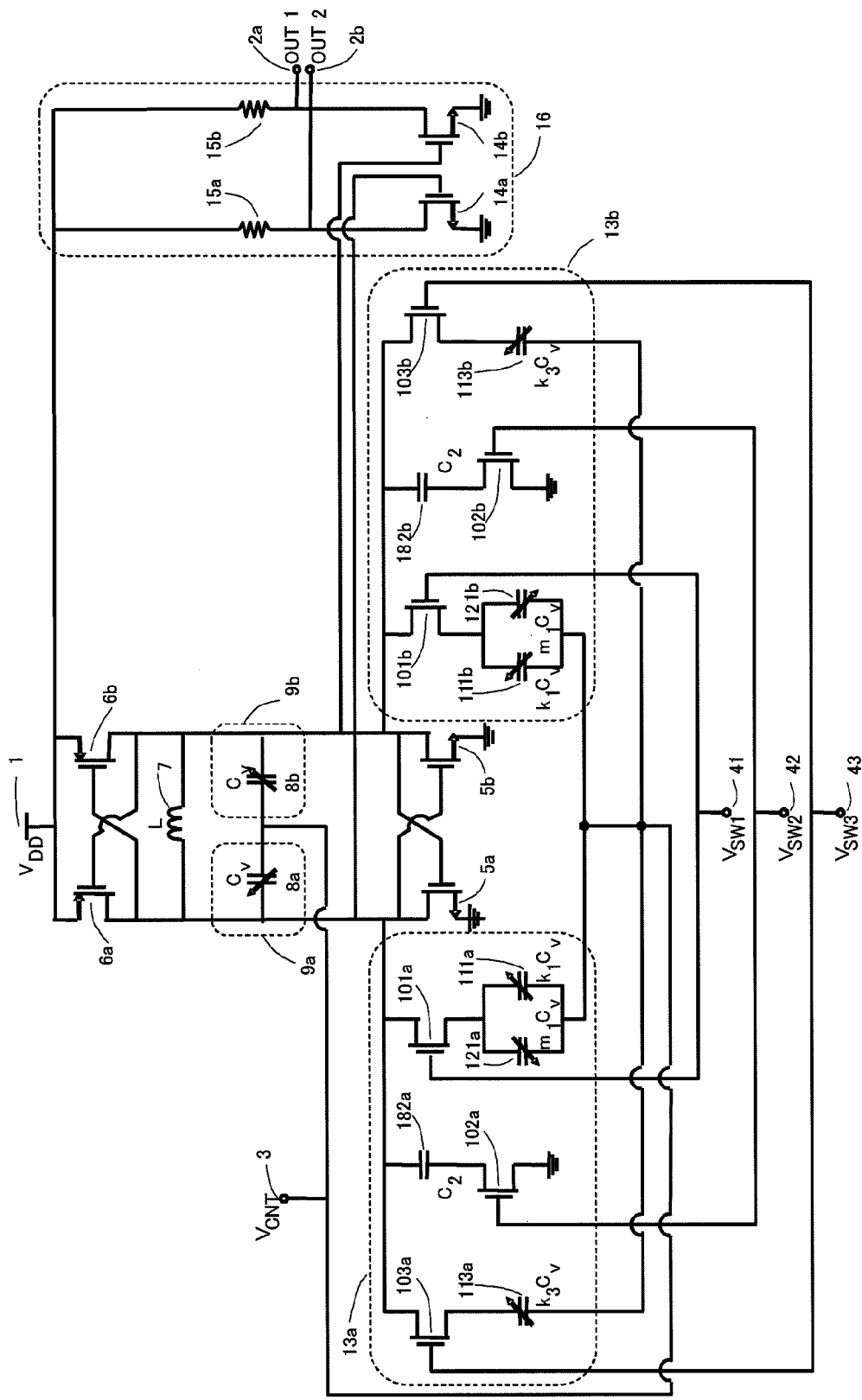
FIG. 12 is a circuit diagram of a voltage-controlled oscillator according to a fourth exemplary embodiment of the present invention.

FIG. 12 is a circuit diagram of a voltage-controlled oscillator according to a fourth exemplary embodiment of the present invention. Components identical with those of the voltage-controlled oscillator illustrated in FIG. 1 are designated by like reference characters and need not be described again. This exemplary embodiment corresponds to a mixture of the circuit arrangement shown in FIG. 10 and the circuit arrangement shown in FIG. 11. That is, the pairs of variable capacitance elements corresponding to the second bit of the three bits are formed by respective single fixed capacitance elements 182a, 182b, and the pairs of variable capacitance elements corresponding to the third bit of the three bits are formed by respective single variable capacitance elements 113a, 113b.

Fifth Exemplary Embodiment

Figure 13:
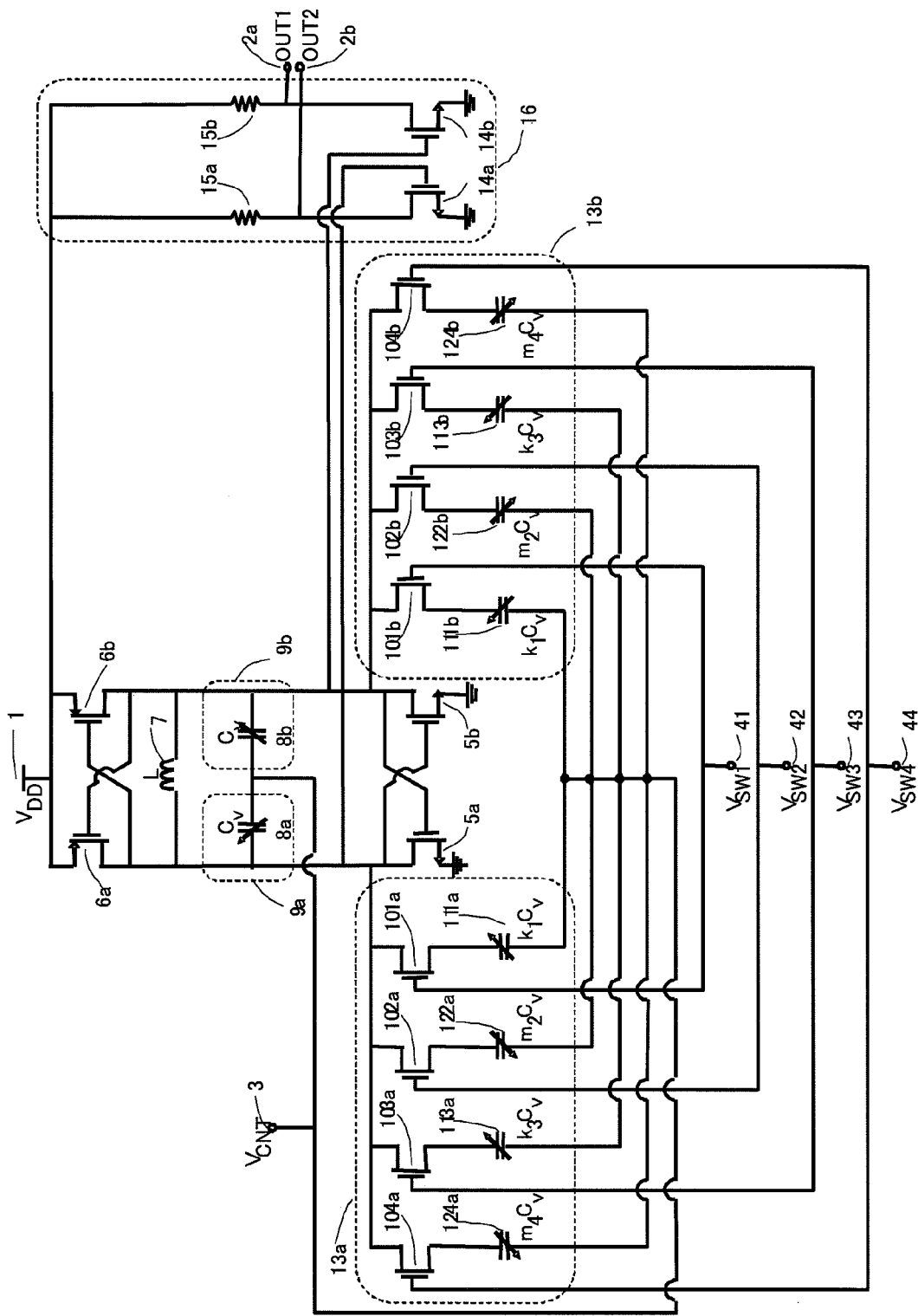
FIG. 13 is a circuit diagram of a voltage-controlled oscillator according to a fifth exemplary embodiment of the present invention.

FIG. 13 is a circuit diagram of a voltage-controlled oscillator according to a fifth exemplary embodiment of the present invention. Components identical with those of the voltage-controlled oscillator illustrated in FIG. 1 are designated by like reference characters and need not be described again. In the voltage-controlled oscillator of this exemplary embodiment, each pair of variable capacitance elements corresponding to each bit of the switched-capacitance bank units 13a, 13b is formed by a single variable capacitance element, and the connecting directions of the variable capacitance elements are a mixture of the forward and reverse directions. FIG. 13 is an example in which the switched-capacitance bank units 13a, 13b are composed of two bits in the forward direction and two bits in the reverse direction (for a total of four bits).

The operation of the voltage-controlled oscillator according to this exemplary embodiment will now be described. When variable capacitance elements $k_iC_V$ are connected to the VCO, which includes the variable capacitance $C_V$ and parasitic capacitance $C_f$, in the forward direction, the VCO gain is given by the following equation in a manner similar to Equation (5):

$$\left.\frac{\partial f}{\partial v_{CNT}}\right|_{v_{CNT}=v_0} = -\frac{1}{4\pi\sqrt{\frac{L}{2}}} \frac{1+k_i}{\left[C_f + C_v(v_{CNT}=v_0) + k_iC_v(v_{CNT}=v_0)\right]^{\frac{3}{2}}} \left.\frac{\partial C_v}{\partial v_{CNT}}\right|_{v_{CNT}=v_0} \quad (10)$$

Whether the VCO gain increases, decreases or is unchanged owing to the addition of the variable capacitance element $k_iC_V$ is decided by the values of $k_i$ and $C_f/C_V$.

This exemplary embodiment assumes a case where the VCO gain is increased by appending the variable capacitance element $k_iC_V$. On the other hand, when variable capacitance elements $m_iC_V$ are connected to the VCO, which includes the variable capacitance $C_V$ and parasitic capacitance $C_f$ in the reverse direction, the VCO gain is given by the following equation:

$$\frac{\partial f}{\partial v_{CNT}}\bigg|_{v_{CNT}=v_0} = -\frac{1}{4\pi\sqrt{\frac{L}{2}}}\frac{1-m_i}{\left[C_f + C_v(v_{CNT}=v_0) + \right]^{\frac{3}{2}}}\frac{\partial C_v}{\partial v_{CNT}}\bigg|_{v_{CNT}=v_0} \quad (11)$$

In this case, the VCO gain is reduced by appending the variable capacitance element $m_iC_V$.

Accordingly, if each bit of the switched-capacitance bank units 13a, 13b is formed by a single variable capacitance element and the connecting directions of the variable capacitance elements are mixed in the forward and reverse directions at a suitable ratio, then, instead of VCO gain varying monotonously in a single direction in accordance with a change in center frequency, the VCO gain can be made to fall within a fixed range while an increase and decrease thereof is repeated.

Sixth Exemplary Embodiment

Figure 14:
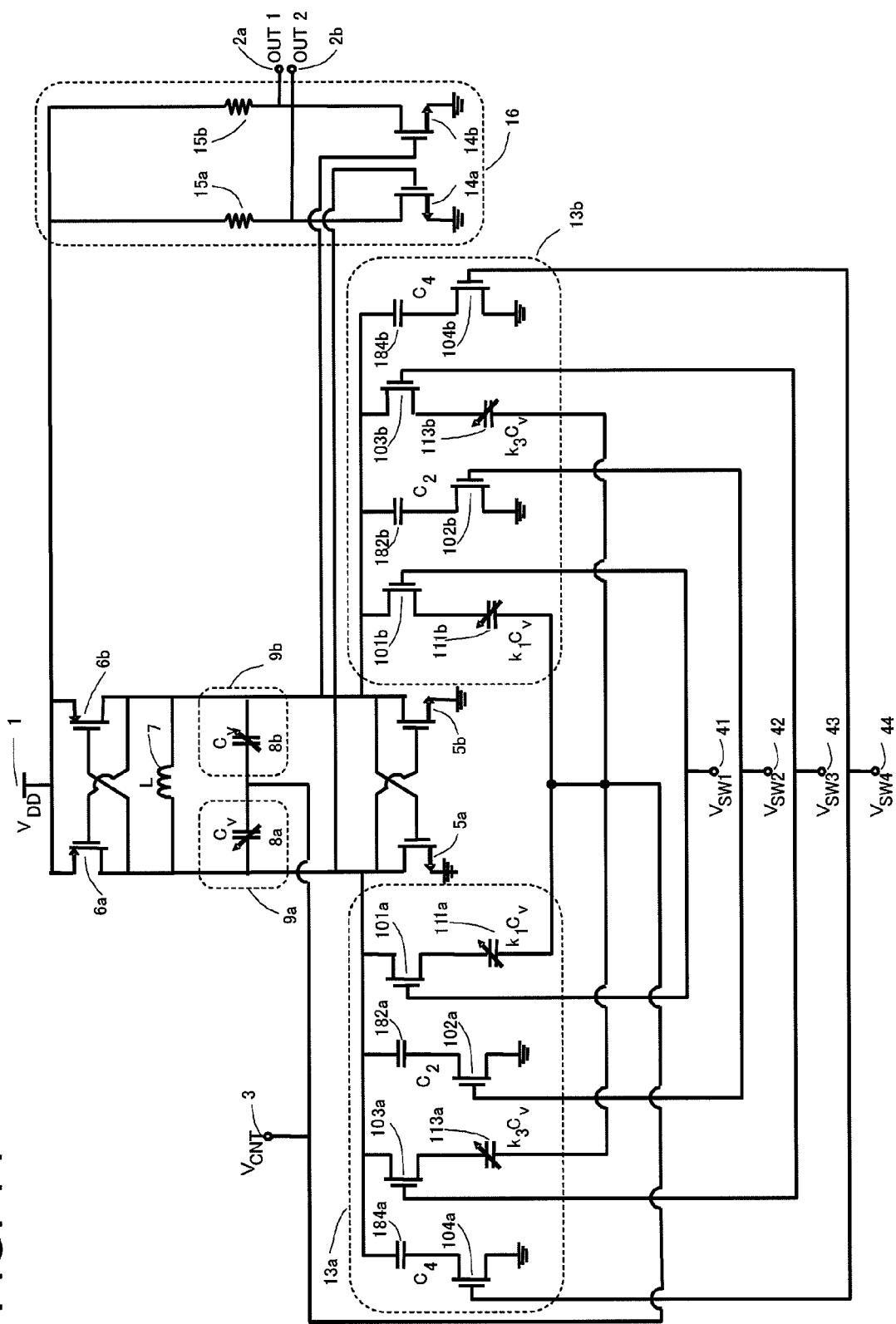
FIG. 14 is a circuit diagram of a voltage-controlled oscillator according to a sixth exemplary embodiment of the present invention.

FIG. 14 is a circuit diagram of a voltage-controlled oscillator according to a sixth exemplary embodiment of the present invention. Components in FIG. 14 identical with those of the voltage-controlled oscillator illustrated in FIG. 13 are designated by like reference characters and need not be described again. In the voltage-controlled oscillator of this exemplary embodiment, the variable capacitance elements connected in the direction of reverse polarity in FIG. 13 are replaced with respective fixed capacitance elements 182a, 184a, 182b, 184b. The operating principle is similar to that described in the fifth exemplary embodiment.

Seventh Exemplary Embodiment

Figure 15:
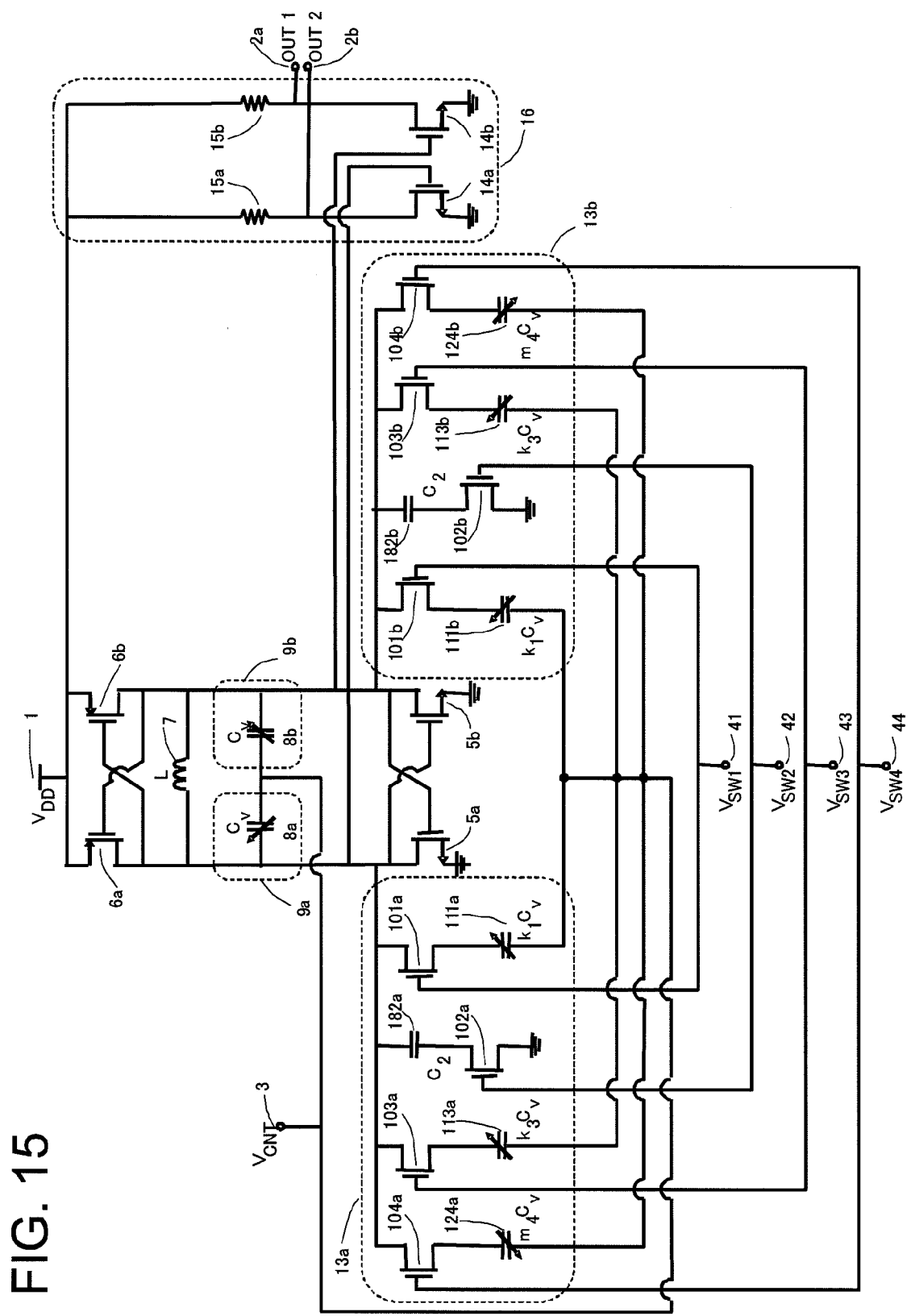
FIG. 15 is a circuit diagram of a voltage-controlled oscillator according to a seventh exemplary embodiment of the present invention.

FIG. 15 is a circuit diagram of a voltage-controlled oscillator according to a seventh exemplary embodiment of the present invention. Components in FIG. 15 identical with those of the voltage-controlled oscillator illustrated in FIG. 13 are designated by like reference characters and need not be described again. The voltage-controlled oscillator of this exemplary embodiment is a mixture of the voltage-controlled oscillator of the fifth exemplary embodiment shown in FIG. 13 and voltage-controlled oscillator of the sixth exemplary embodiment shown in FIG. 14. That is, the variable capacitance elements having the forward polarity direction, the variable capacitance element having the reverse polarity direction and the fixed capacitance elements are mixed together. The operating principle is similar to that described in the fifth and sixth exemplary embodiments.

Eighth Exemplary Embodiment

Figure 16:
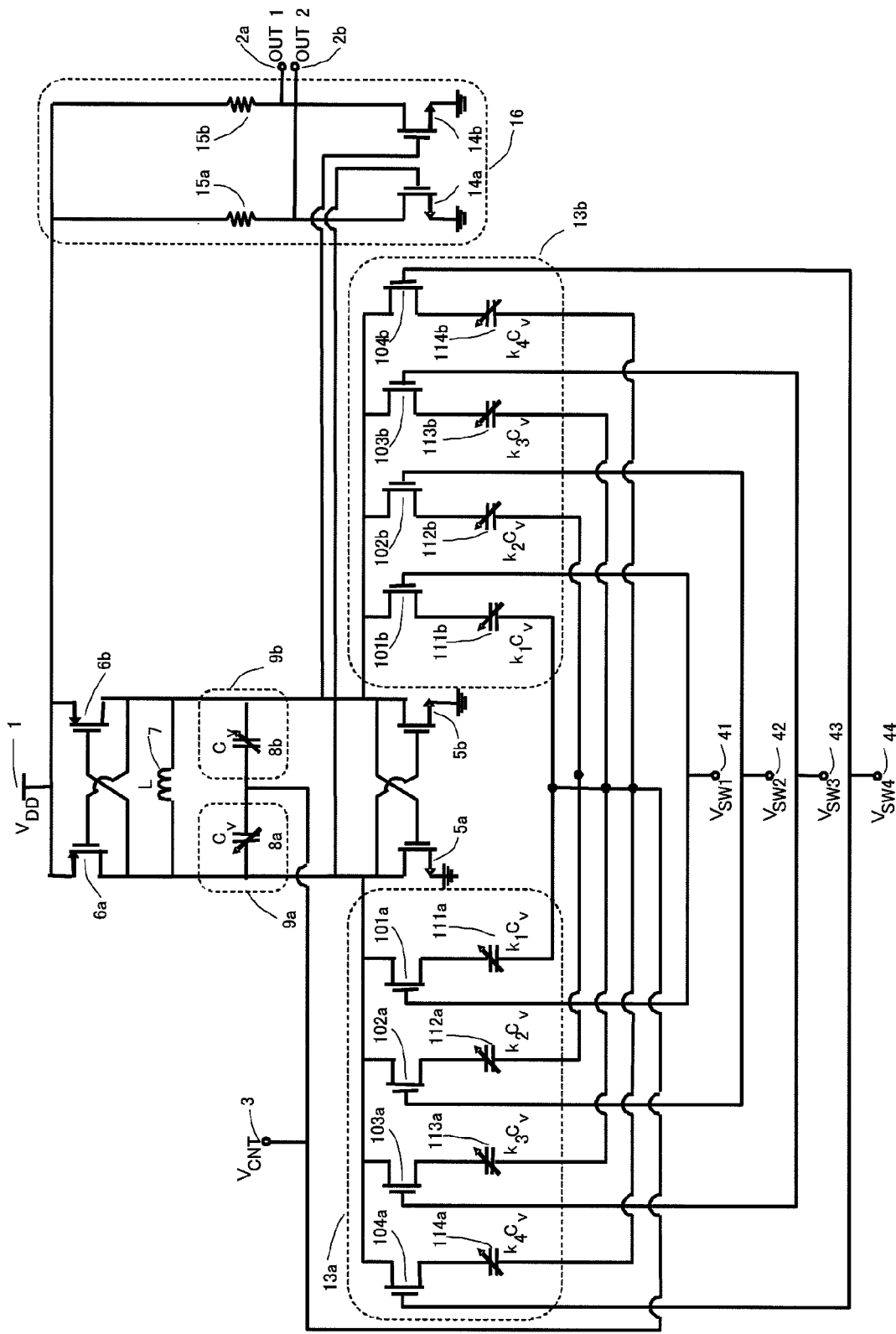
FIG. 16 is a circuit diagram of a voltage-controlled oscillator according to a eighth exemplary embodiment of the present invention.

FIG. 16 is a circuit diagram of a voltage-controlled oscillator according to an eighth exemplary embodiment of the present invention. Components in FIG. 16 identical with those of the voltage-controlled oscillator of the first exemplary embodiment illustrated in FIG. 1 are designated by like reference characters and need not be described again. In the voltage-controlled oscillator of this exemplary embodiment, each bit of the switched-capacitance bank units 13a, 13b is formed by one variable capacitance element connected in the forward direction. That is, this is equivalent to FIG. 4. In the description of the fifth exemplary embodiment, it is stated that whether the VCO gain increases, decreases or is unchanged owing to the addition of the forward-connected variable capacitance element $k_iC_V$ is decided by the values of $k_i$ and $C_f/C_V$. In this exemplary embodiment, a case is assumed in which the VCO gain is substantially unchanged owing to addition of the variable capacitance element $k_iC_V$. However, since the value of $k_i$ is a quantity that should be decided from the required performance, as mentioned in the description of the first exemplary embodiment, often this condition is not satisfied.

Ninth Exemplary Embodiment

Figure 17:
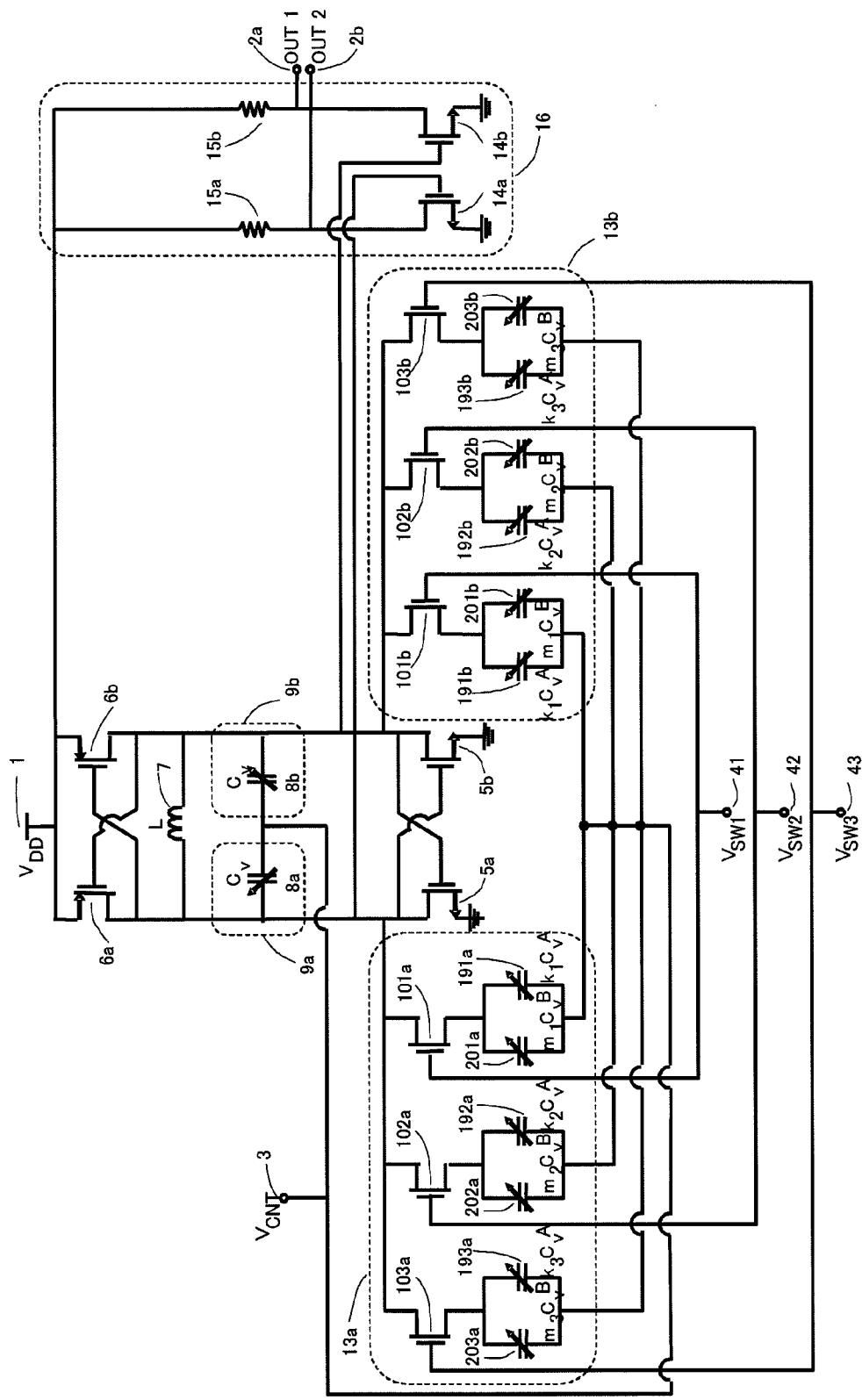
FIG. 17 is a circuit diagram of a voltage-controlled oscillator according to a ninth exemplary embodiment of the present invention.
Figure 18:
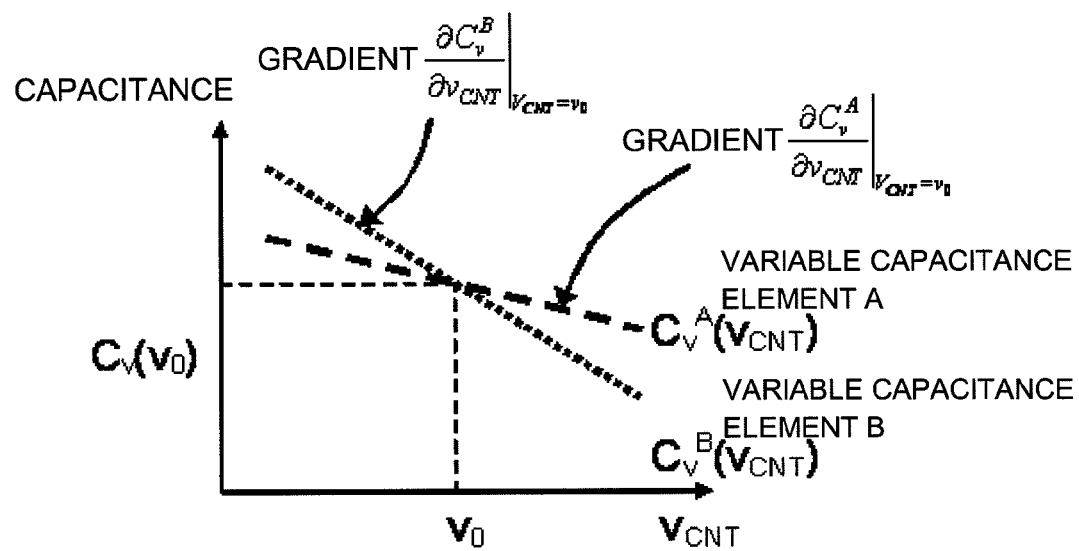
FIG. 18 is a diagram illustrating a capacitance vs. control voltage characteristic of a variable capacitance element according to a ninth exemplary embodiment of the present invention.

FIG. 17 is a circuit diagram of a voltage-controlled oscillator according to a ninth exemplary embodiment of the present invention. Components in FIG. 17 identical with those of the voltage-controlled oscillator of the first exemplary embodiment illustrated in FIG. 1 are designated by like reference characters and need not be described again. In the voltage-controlled oscillator of this exemplary embodiment, each bit of the switched-capacitance bank units 13a, 13b is formed by a pair of variable capacitance elements comprising a variable capacitance element A [19ia, 19ib (i=1, 2, 3)] and a variable capacitance element B [20ia, 20ib (i=1, 2, 3)] of different types. "Variable capacitance elements of different types" refers to capacitance elements having different gradients with respect to the loop control voltage $V_{CNT}$ when the respective elements sizes have been chosen in such a manner that the capacitance values at the center voltage will be identical. Functions $C_V^A(V_{CNT})$ and $C_V^B(V_{CNT})$ are normalized in such a manner that $C_V^A(V_{CNT}=V_0)=C_V^B(V_{CNT}=V_0)=C_V(V_{CNT}=V_0)$ hold.

Figure 19:
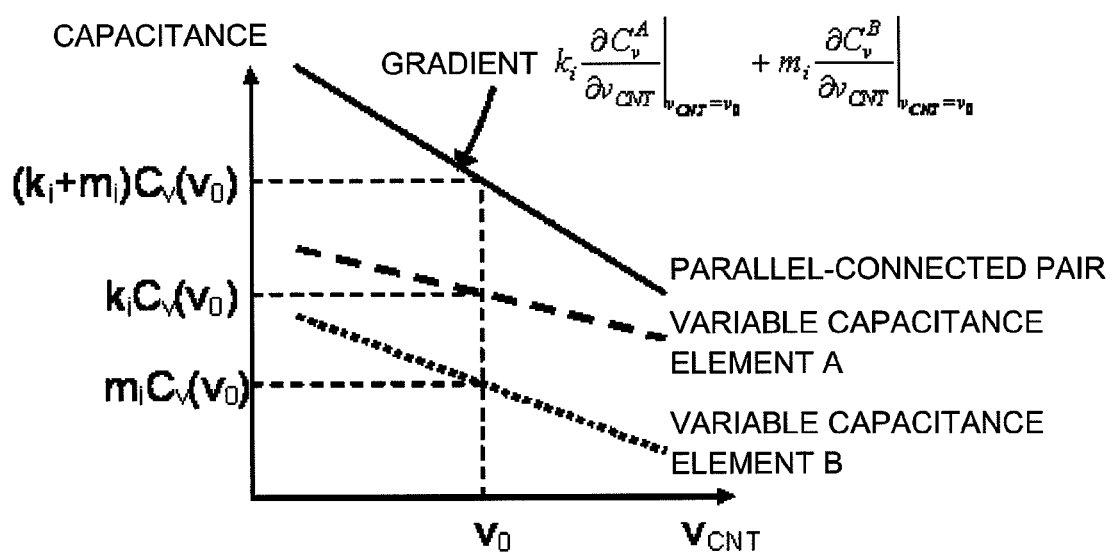
FIG. 19 is a second diagram illustrating a capacitance vs. control voltage characteristic of a variable capacitance element according to a ninth exemplary embodiment of the present invention.

FIG. 19 illustrates a capacitance vs. control voltage characteristic of one pair of variable capacitance elements in the circuit shown in FIG. 17. By adding elements having different gradients per unit capacitance together, it is possible to control the gradient independently of the absolute value of the pair of variable capacitance elements at the center voltage.

Figure 20:
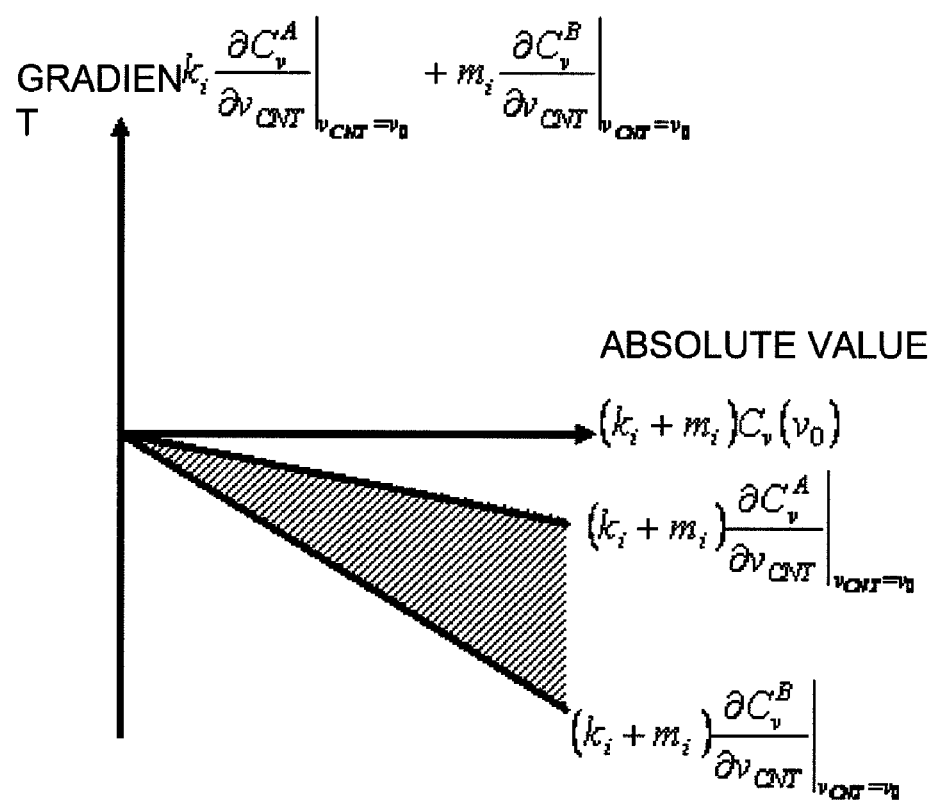
FIG. 20 is a diagram illustrating the relationship between the absolute value of a pair of variable capacitance elements at a center voltage and gradient with respect to control voltage in a ninth exemplary embodiment of the present invention.

FIG. 20 is a diagram illustrating the relationship between the absolute value of a pair of variable capacitance elements at a center voltage and gradient with respect to control voltage in this case. The gradient with respect to control voltage can be controlled within the range of the shaded area in FIG. 20 with respect to each absolute value of the pair of variable capacitance elements at the center voltage. This means that the VCO gain can be set freely within a certain range even if frequency range achieved by changing a switch setting has been decided.

Tenth Exemplary Embodiment

Figure 21:
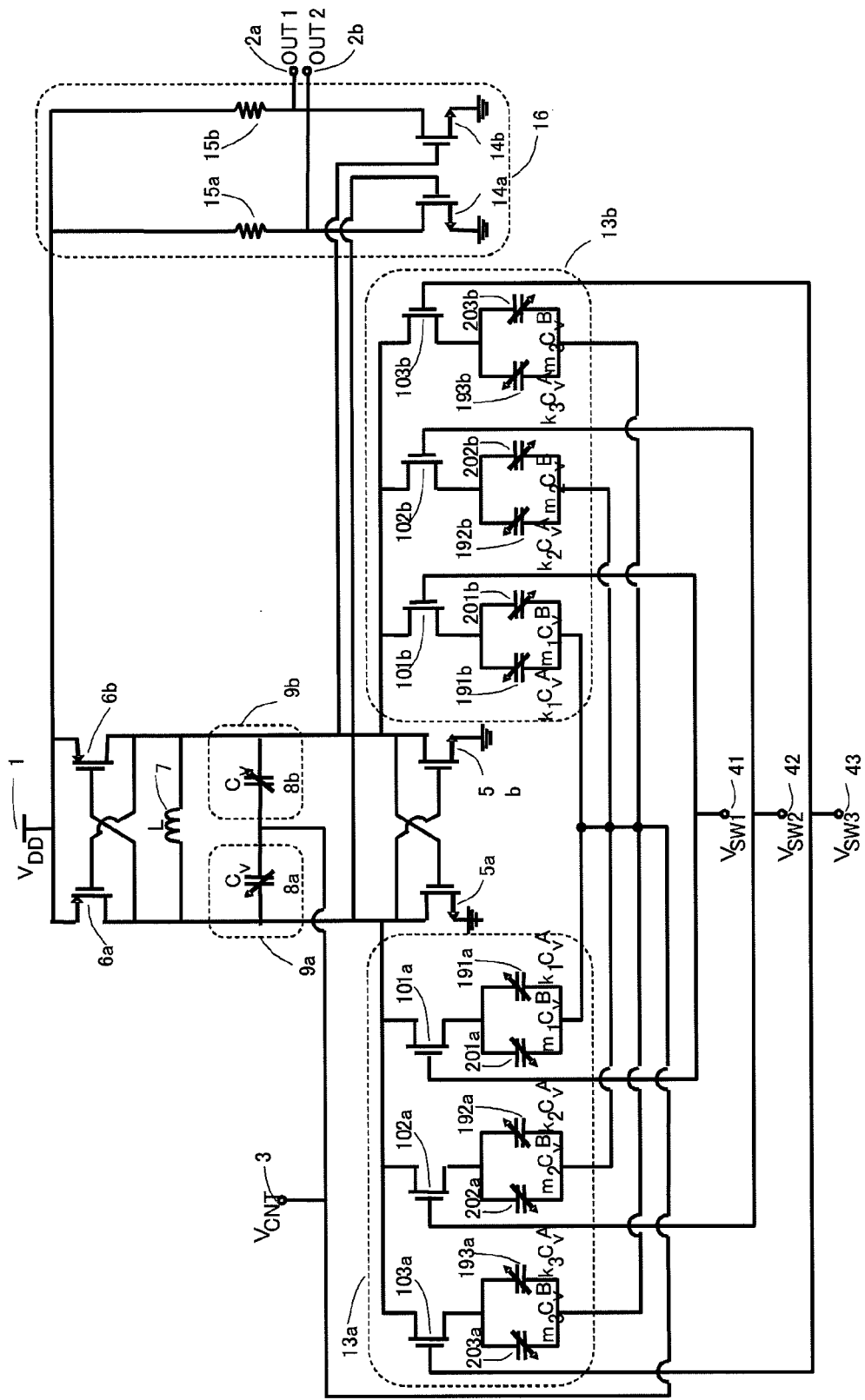
FIG. 21 is a circuit diagram of a voltage-controlled oscillator according to a tenth exemplary embodiment of the present invention.
Figure 22:
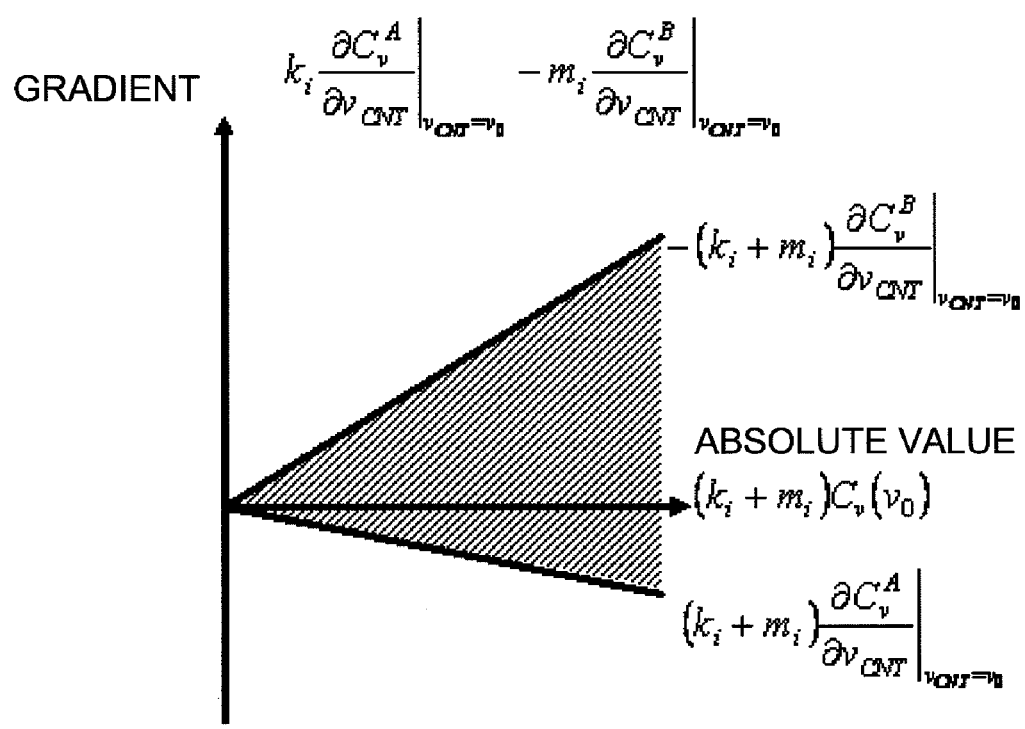
FIG. 22 is a diagram illustrating the relationship between the absolute value of a pair of variable capacitance elements at a center voltage and gradient with respect to control voltage in a tenth exemplary embodiment of the present invention.

FIG. 21 is a circuit diagram of a voltage-controlled oscillator according to a tenth exemplary embodiment of the present invention. Components in FIG. 21 identical with those of the voltage-controlled oscillator illustrated in FIG. 17 are designated by like reference characters and need not be described again. The voltage-controlled oscillator of this exemplary embodiment is such that one variable capacitance element [20ia, 20ib (i=1, 2, 3)] of each pair of variable capacitance elements is connected in the direction of reverse polarity as compared with the voltage-controlled oscillator of the ninth exemplary embodiment shown in FIG. 17. FIG. 22 is a diagram illustrating the relationship between the absolute value of a pair of variable capacitance elements at a center voltage and gradient with respect to control voltage in this case. The gradient with respect to control voltage can be controlled within the range of the shaded area in FIG. 22 with respect to each absolute value of the pair of variable capacitance elements at the center voltage. This means that the VCO gain can be set freely within a certain range even if frequency range achieved by changing a switch setting has been decided.

11th Exemplary Embodiment

Figure 23:
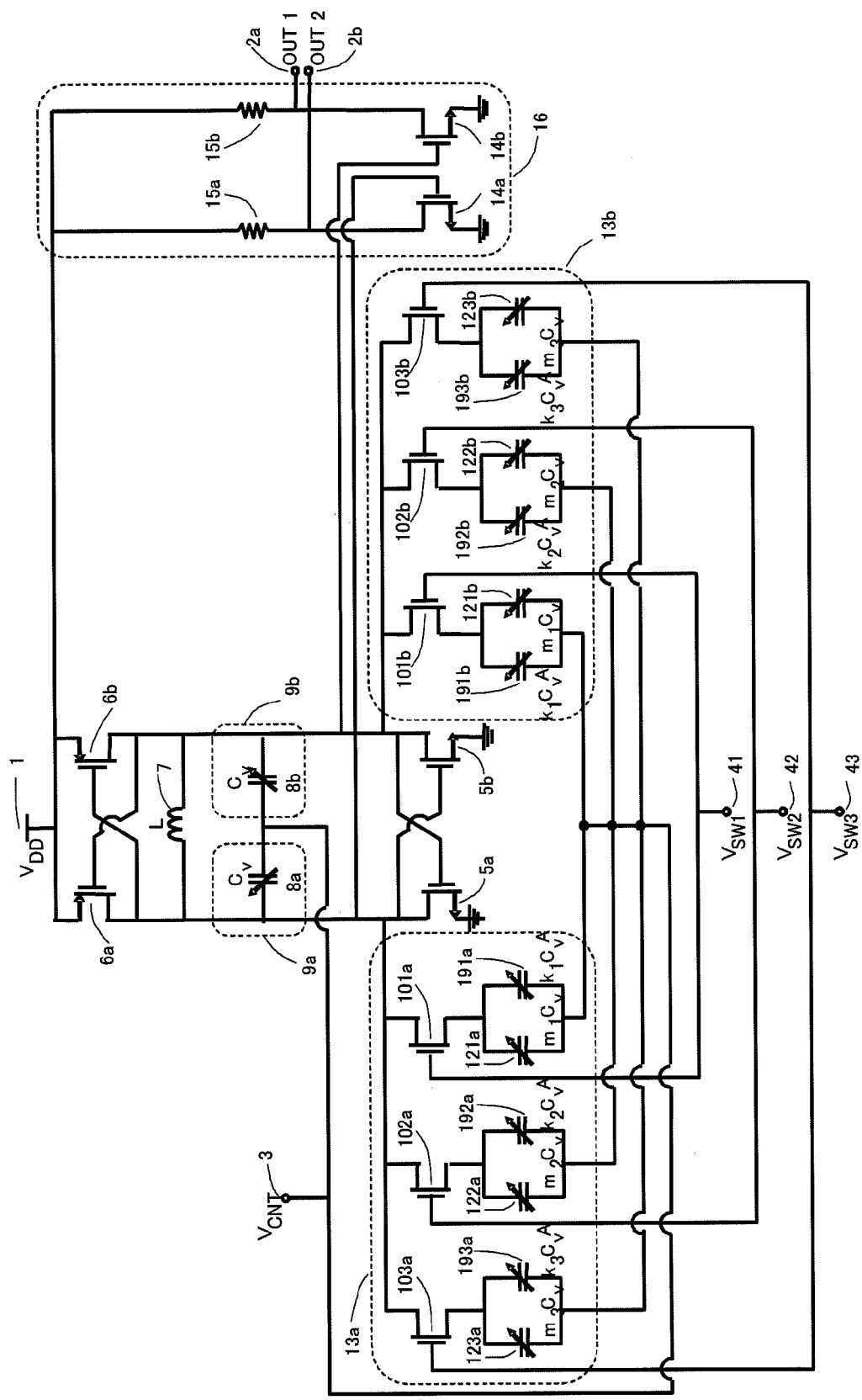
FIG. 23 is a circuit diagram of a voltage-controlled oscillator according to an 11th exemplary embodiment of the present invention.

FIG. 23 is a circuit diagram of a voltage-controlled oscillator according to an 11th exemplary embodiment of the present invention. Components in FIG. 23 identical with those of the voltage-controlled oscillator of the ninth exemplary embodiment illustrated in FIG. 17 are designated by like reference characters and need not be described again. The voltage-controlled oscillator of this exemplary embodiment is such that one variable capacitance element [20ia, 20ib (i=1, 2, 3)] of each pair of variable capacitance elements is constituted by a capacitance element [12ia, 12ib (i=1, 2, 3)] of the same type as that of the variable capacitance elements 8a, 8b as opposed to the voltage-controlled oscillator of the ninth exemplary embodiment shown in FIG. 17. Similarly, in the voltage-controlled oscillator of the tenth exemplary embodiment shown in FIG. 21, it is possible for one variable capacitance element of each pair of variable capacitance elements to be constituted by a capacitance element of the same type as that of the variable capacitance elements 8a, 8b.

12th Exemplary Embodiment

Figure 24:
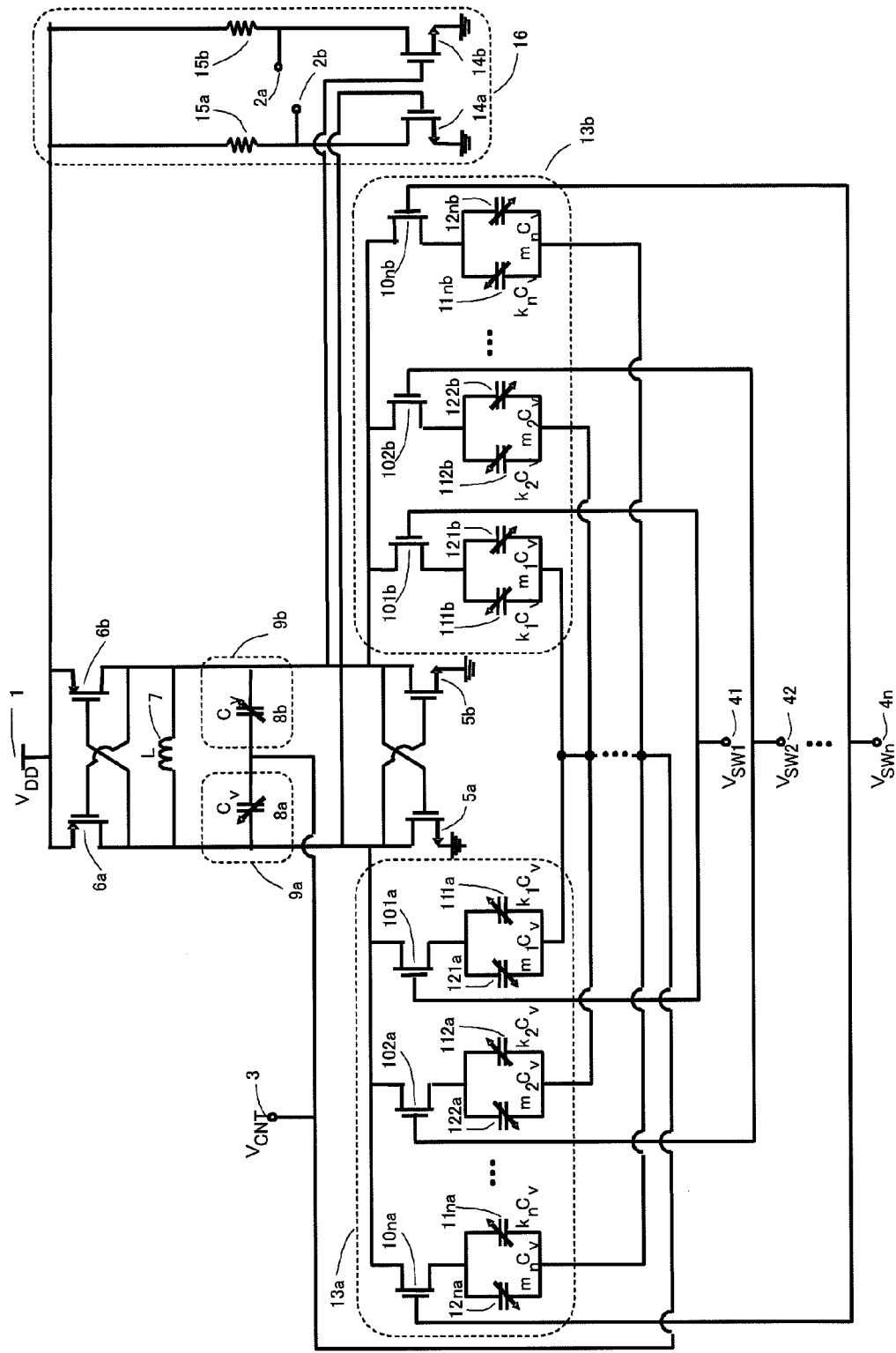
FIG. 24 is a circuit diagram of a voltage-controlled oscillator according to a 12th exemplary embodiment of the present invention.

FIG. 24 is a circuit diagram of a voltage-controlled oscillator according to a 12th exemplary embodiment of the present invention. Components in FIG. 24 identical with those of the voltage-controlled oscillator illustrated in FIG. 1 are designated by like reference characters and need not be described again. In the voltage-controlled oscillator of the first exemplary embodiment, selection of the frequency band is performed using three bits. However, the number of bits can be set to any number. The configuration of the voltage-controlled oscillator of this exemplary embodiment is illustrated in general for a case where n is the number of bits (where n is any natural number).

Although the other exemplary embodiments discussed thus far have been described taking three bits or four bits as examples, the invention is similarly applicable to a case where any number of bits is employed.

13th Exemplary Embodiment

Figure 25:
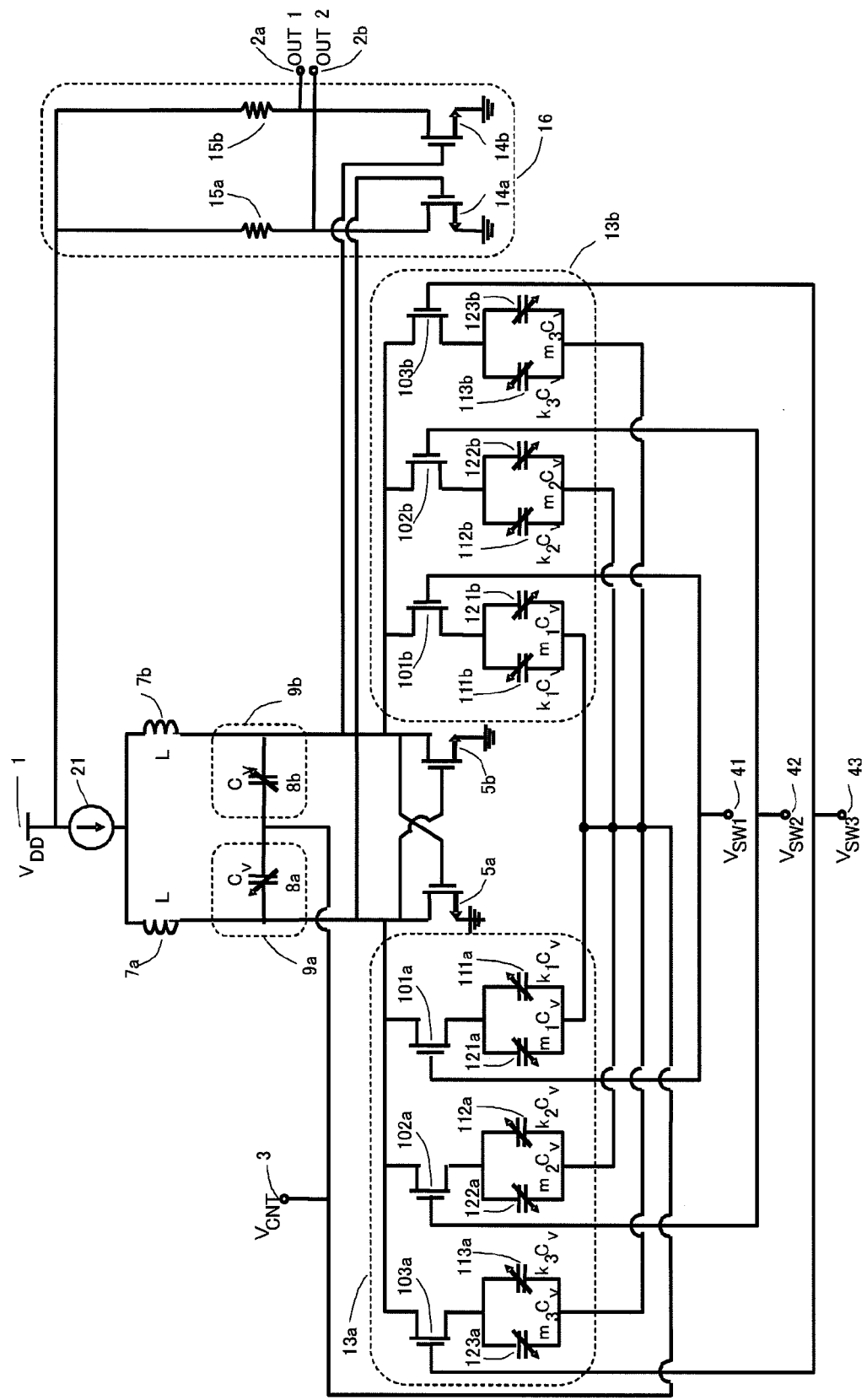
FIG. 25 is a circuit diagram of a voltage-controlled oscillator according to a 13th exemplary embodiment of the present invention.

FIG. 25 is a circuit diagram of a voltage-controlled oscillator according to a 13th exemplary embodiment of the present invention. Components in FIG. 24 identical with those of the voltage-controlled oscillator illustrated in FIG. 1 are designated by like reference characters and need not be described again. In the voltage-controlled oscillator of the first exemplary embodiment, the generation of negative resistance is of the complementary (CMOS) type using both NMOS and PMOS transistors for cross-coupling. However, the present invention is applicable to a voltage-controlled oscillator using any negative-resistance generating circuit. The voltage-controlled oscillator of this exemplary embodiment is one example in which the negative-resistance generating circuit is composed of NMOS transistors 5a, 5b for cross-coupling (i.e., construction is of NMOS type) and, moreover a current source 21 is provided between the power supply terminal 1 and inductors 7a, 7b.

The form of the negative-resistance generating circuit does not matter with regard to the voltage-controlled oscillators of the other exemplary embodiments discussed thus far. In addition, the form of the circuits of portions not directly related to operation of the present invention are not limited to the exemplary embodiments described in this invention.

14th Exemplary Embodiment

Figure 26:
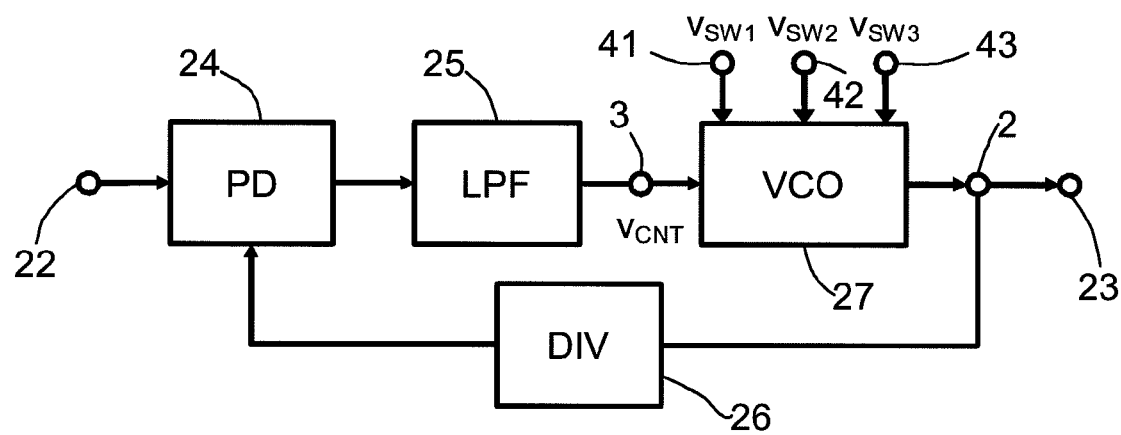
FIG. 26 is a block diagram of a phase-locked loop (PLL) circuit according to a $14^{th}$ exemplary embodiment of the present invention.

FIG. 26 is a block diagram of a phase-locked loop (PLL) circuit according to a 14th exemplary embodiment of the present invention. In FIG. 26, a voltage-controlled oscillator 27 is the voltage-controlled oscillator illustrated in any one of FIG. 1, FIGS. 10 to 17, FIG. 21 and FIGS. 23 to 25. The outputs of the voltage-controlled oscillator illustrated in any one of FIG. 1, FIGS. 10 to 17, FIG. 21 and FIGS. 23 to 25 are differential outputs. For the sake of simplicity, however, here the outputs 2a, 2b are consolidated and illustrated as output 2.

The PLL circuit of this exemplary embodiment includes the voltage-controlled oscillator 27, an input terminal 22 to which a reference clock signal is input, a clock signal output terminal 23, a phase comparator 24, a loop filter 25 and a frequency divider 26. The phase comparator 24 compares a signal obtained by frequency-dividing the output 2 of the voltage-controlled oscillator 27 by the frequency divider 26 and the reference clock signal applied to the input terminal 22, and supplies a comparison-error signal to the loop control terminal 3 of the voltage-controlled oscillator 27 via the loop filter 25. The voltage-controlled oscillator 27 changes the frequency band of the oscillation signal by frequency-band selection signals input to the frequency-band selection terminals 41, 42, 43, and is also controlled by the phase-error signal so as to vary the oscillation frequency.

By varying the frequency-band selection signals input to the frequency-band selection terminals 41, 42, 43, the center frequency of the voltage-controlled oscillator can be changed over and it is possible for the PLL circuit to operate in a plurality of frequency bands. Since the VCO gain is held constant by the present invention at this time, the gain of the PLL also is held constant. Accordingly, it is possible for optimum PLL operation to be achieved in a plurality of operating frequency bands.

In the description rendered above, a case where the gain of constituent blocks other than the voltage-controlled oscillator is not dependent upon the operating frequency band is assumed. However, there are also cases where the gain of constituent blocks other than the voltage-controlled oscillator, such as the phase comparator 24, changes depending upon the operating frequency band. In such case a specific VCO gain fluctuation (the relationship between VCO gain and center frequency) that will hold the gain of the overall loop constant is found. In this case also any relationship between VCO gain and center frequency can be approximately produced if the voltage-controlled oscillator 27 of the present invention is used.

15th Exemplary Embodiment

Figure 27:
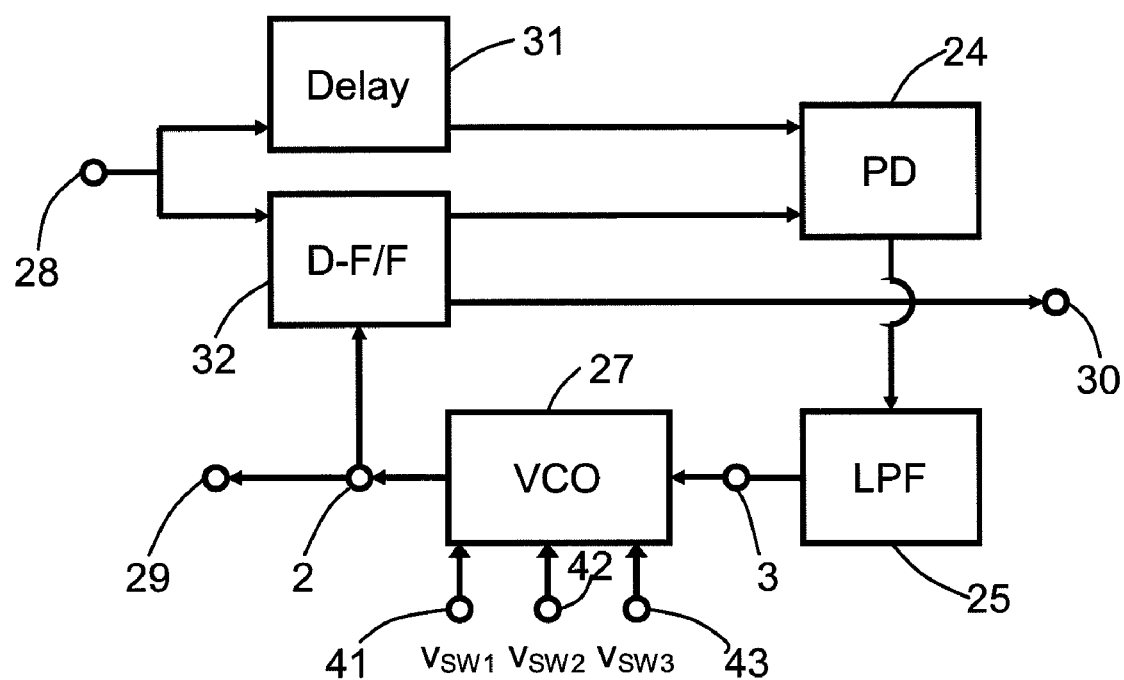
FIG. 27 is a block diagram of a clock and data recovery (CDR) circuit according to a $15^{th}$ exemplary embodiment of the present invention.

FIG. 27 is a block diagram of a clock and data recovery (CDR) circuit according to a 15th exemplary embodiment of the present invention. This illustrates an example of application of the present invention to a voltage-controlled oscillator. In FIG. 27, the voltage-controlled oscillator 27 is the voltage-controlled oscillator illustrated in any one of FIG. 1, FIGS. 10 to 17, FIG. 21 and FIGS. 23 to 25.

The CDR circuit of this exemplary embodiment includes the 27, the phase comparator 24, the loop filter 25, a data signal input terminal 28, a recovery clock signal output terminal 29, a recovery data signal output terminal 30, a delay circuit 31 and a flip-flop 32. The flip-flop 32 re-times the input signal at the data signal input terminal 28 by the output 2 of the voltage-controlled oscillator 27 and outputs the resultant signal to the recovery data signal output terminal 30 and phase comparator 24. The phase comparator 24 compares the output signal of the flip-flop 32 and the signal obtained by delaying the input signal of the data signal input terminal 28 via the delay circuit 31 and supplies a comparison-error signal to the voltage-controlled oscillator 27 via the loop filter 25. The voltage-controlled oscillator 27 changes the frequency band of the oscillation signal by frequency-band selection signals input to the frequency-band selection terminals 41, 42, 43, and is also controlled by the phase-error signal so as to vary the oscillation frequency.

By varying the frequency-band selection signals input to the frequency-band selection terminals 41, 42, 43, the center frequency of the voltage-controlled oscillator can be changed over and it is possible for the CDR circuit to operate at a plurality of bit rates. Since the VCO gain is held constant by the present invention at this time, the loop gain also is held constant. Accordingly, it is possible for optimum CDR operation to be achieved in a plurality of operating frequency bands.

In the description rendered above, a case where the gain of constituent blocks other than the voltage-controlled oscillator is not dependent upon the operating frequency band is assumed. However, there are also cases where the gain of constituent blocks other than the voltage-controlled oscillator, such as the phase comparator 24, changes depending upon the operating frequency band. In such case a specific VCO gain fluctuation (the relationship between VCO gain and center frequency) that will hold the gain of the overall loop constant is found. In this case also any relationship between VCO gain and center detects can be approximately produced if the voltage-controlled oscillator 27 of the present invention is used.

16$^{th}$ Exemplary Embodiment

Figure 28:
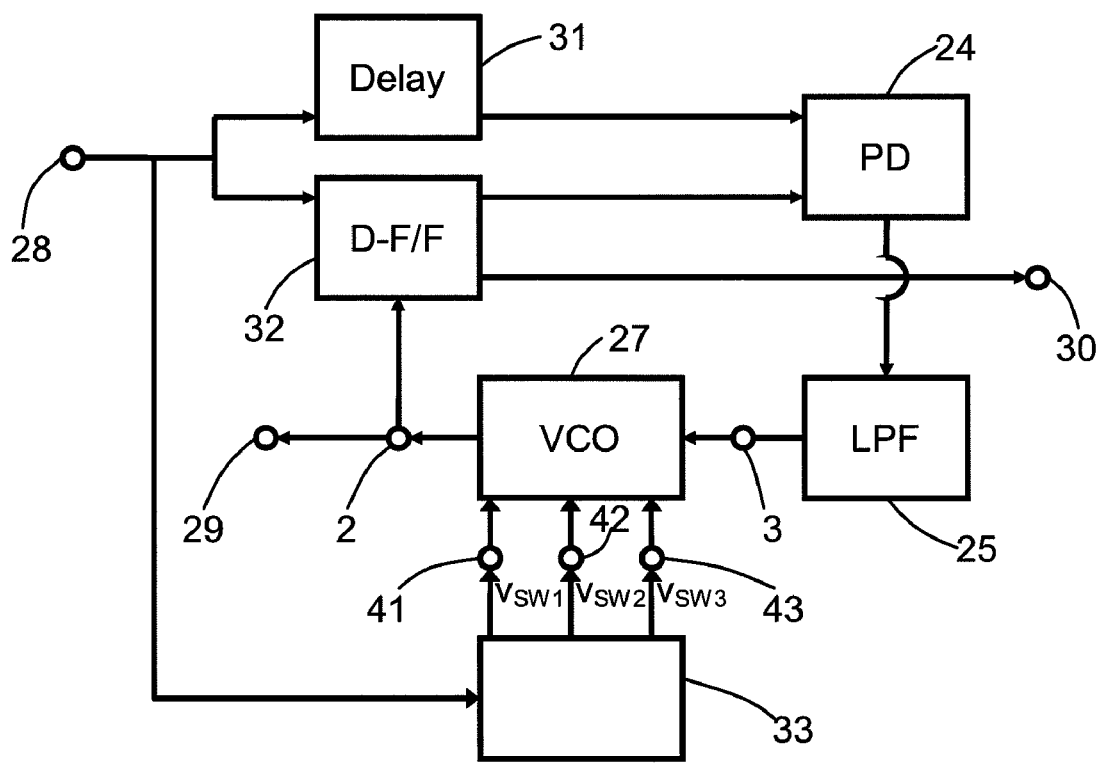
FIG. 28 is a block diagram of a clock and data recovery (CDR) circuit according to a $16^{th}$ exemplary embodiment of the present invention.

FIG. 28 is a block diagram of a clock and data recovery (CDR) circuit according to a 16$^{th}$ exemplary embodiment of the present invention. This illustrates an example of application of the present invention to a voltage-controlled oscillator. In FIG. 28, the voltage-controlled oscillator 27 is the voltage-controlled oscillator illustrated in any one of FIG. 1, FIGS. 10 to 17, FIG. 21 and FIGS. 23 to 25. Components identical with those of the CDR circuit of the 15$^{th}$ exemplary embodiment shown in FIG. 27 are designated by like reference characters.

In this exemplary embodiment, the CDR circuit shown in FIG. 27 is additionally provided with a bit-rate detection circuit 33. The bit-rate detection circuit 33 detects the bit rate of the signal applied to the data signal input terminal 28 and outputs the frequency-band selection signals to the frequency-band selection terminals 41, 42, 43 based upon the detected bit rate. Accordingly, since the setting of the center frequency of the voltage-controlled oscillator 27 is performed automatically in accordance with the bit rate of the input signal, application to systems having different input-signal bit rates is possible without adjustment. At such time VCO gain fluctuation also is suppressed automatically by the voltage-controlled oscillator 27 of the present invention.

In all of the exemplary embodiments set forth above, an arrangement in which the variable capacitance units 9a, 9b are not provided is possible.

Further, although differential-type voltage-controlled oscillators are described in the foregoing exemplary embodiments, the present invention is applicable to single-ended voltage-controlled oscillators as well.

Furthermore, in the foregoing exemplary embodiments, examples in which transistors are used as the switching elements are described. However, it is also possible to use other switching elements.

In the foregoing exemplary embodiments, examples using MOSFETs (Metal Oxide Semiconductor Field-Effect Transistors) as the active elements have been illustrated. However, it is possible to implement the invention similar arrangements also in a case where use is made of MESFETs (Metal Semiconductor Field-Effect Transistors), HEMTs (High Electron Mobility Transistors), bipolar transistors or HBTs (Heterojunction Bipolar Transistors), etc.

Furthermore, examples of design in which a fluctuation in VCO gain is suppressed to the extent possible have been illustrated in the foregoing exemplary embodiments. However, there are also cases where a specific VCO gain fluctuation (relationship between VCO gain and center frequency) is sought based upon the requirements of the PLL loop in which the voltage-controlled oscillator is used. If the voltage-controlled oscillator of the present invention is used in these cases as well, then any relationship between VCO gain and center frequency can be approximately produced.

The disclosures of the patent documents cited above are incorporated by reference in this specification. Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims.

What is claimed is:

1. A voltage-controlled oscillator comprising an inductor and a group of variable capacitance elements forming a resonance circuit;
    wherein said group of variable capacitance elements includes first and second variable capacitance elements connectable in parallel and having mutually different absolute values of a ratio of control-voltage sensitivity to capacitance; and
    said first and second variable capacitance elements both have a first end supplied with a control voltage for controlling resonance frequency of the resonance circuit and have a second end selectively connected to the inductor by a band selection signal for deciding a band in which the resonance frequency exists.

2. The voltage-controlled oscillator according to claim 1, wherein said first and second variable capacitance elements have their second end connected to said inductor via a first switching element;
    and said first switching element can be turned on and off by the band selection signal.

3. The voltage-controlled oscillator according to claim 1, wherein said first and second variable capacitance elements have mutually different element sizes.

4. The voltage-controlled oscillator according to claim 1, wherein said first and second variable capacitance elements have mutually different polarities of the ratio of control-voltage sensitivity to capacitance.

5. The voltage-controlled oscillator according to claim 1, wherein said first and second variable capacitance elements have mutually identical polarities of the ratio of control-voltage sensitivity to capacitance.

6. The voltage-controlled oscillator according to claim 1, wherein said group of variable capacitance elements further includes a first series circuit composed of a third variable capacitance element and a second switching element;
   said third variable capacitance element has a first end supplied with the control voltage and a second end connected to said inductor via said second switching element; and
   said second switching element can be turned on and off by the band selection signal.

7. The voltage-controlled oscillator according to claim 1, wherein said group of variable capacitance elements further includes a second series circuit composed of a fixed capacitance element and a third switching element;
   said second series circuit has a first end connected to ground and a second end connected to said inductor; and
   said third switching element can be turned on and off by the band selection signal.

8. The voltage-controlled oscillator according to any claim 1, wherein differential oscillation signals are capable of being output.

9. The voltage-controlled oscillator according to claim 1, wherein a single-ended oscillation signal is capable of being output.

10. A phase-locked loop circuit using the voltage-controlled oscillator set forth in claim 1.

11. A clock and data recovery circuit using the voltage-controlled oscillator set forth in claim 1.

* * * * *